(12) United States Patent
Stroth et al.

(10) Patent No.: US 6,466,029 B2
(45) Date of Patent: Oct. 15, 2002

(54) POWER LINE TESTING DEVICE WITH SIGNAL GENERATOR AND SIGNAL DETECTOR

(75) Inventors: John E. Stroth, Oak Park, IL (US); Peter Stroth, Forest Park, IL (US); Joachim Wottrich, Hamburg-Norstedt (DE)

(73) Assignee: Contact Technology Systems, Inc., Oak Park, IL (US)

( * ) Notice: Subject to any disclaimer, the term of this patent is extended or adjusted under 35 U.S.C. 154(b) by 16 days.

(21) Appl. No.: 09/826,143

(22) Filed: Apr. 4, 2001

(65) Prior Publication Data

US 2002/0039026 A1 Apr. 4, 2002

Related U.S. Application Data

(60) Provisional application No. 60/194,726, filed on Apr. 4, 2000.

(51) Int. Cl.[7] .................. G01R 31/14; G01R 19/14; G01R 31/327; H02H 3/00
(52) U.S. Cl. ................ 324/509; 508/133; 508/424; 361/42; 361/96
(58) Field of Search .................. 324/424, 536, 324/423, 529, 66, 133, 67, 509, 508, 510; 361/42, 45, 50, 87

(56) References Cited

U.S. PATENT DOCUMENTS

| | | | |
|---|---|---|---|
| 3,996,496 A | * 12/1976 | Volk, Jr. | ............... 361/50 |
| 4,082,995 A | * 4/1978 | Rhude | ............... 324/508 |
| 4,129,825 A | * 12/1978 | Brinegar | ............... 324/523 |
| 4,556,882 A | * 12/1985 | Brifman et al. | ............ 340/3.44 |
| 4,642,556 A | 2/1987 | Pecukonis | ............... 324/67 |
| 4,906,938 A | 3/1990 | Konopka | |
| 4,929,887 A | 5/1990 | Robitaille et al. | |
| 4,906,938 A | 2/1995 | Konopka | |
| 5,459,630 A | 10/1995 | MacKenzie et al. | |
| 5,497,094 A | 3/1996 | George | |
| 5,513,373 A | * 4/1996 | Damkier | ............... 710/16 |
| 5,625,285 A | 4/1997 | Virgillo | |
| 5,834,940 A | * 11/1998 | Brooks et al. | ............ 324/424 |
| 5,875,087 A | 2/1999 | Spencer et al. | |
| 5,963,406 A | * 10/1999 | Neiger et al. | ............... 361/42 |
| 5,969,516 A | 10/1999 | Wottrich | |
| 5,982,593 A | * 11/1999 | Kimblin et al. | ............... 361/42 |
| 6,054,931 A | * 4/2000 | Wottrich | ............... 340/638 |
| 6,088,205 A | * 7/2000 | Neiger et al. | ............... 361/42 |
| 6,128,169 A | * 10/2000 | Neiger et al. | ............... 361/42 |
| 6,154,032 A | 11/2000 | Coia et al. | |
| 6,163,144 A | * 12/2000 | Steber et al. | ............... 324/67 |
| 6,166,532 A | 12/2000 | Coia et al. | |
| 6,191,589 B1 | * 2/2001 | Clunn | ............... 324/424 |
| 6,222,358 B1 | * 4/2001 | Wottrich | ............... 324/67 |
| 6,271,668 B1 | * 8/2001 | Sehdev et al. | ............... 324/529 |
| 6,313,642 B1 | * 11/2001 | Brooks | ............... 324/547 |

* cited by examiner

*Primary Examiner*—N. Le
*Assistant Examiner*—Wasseem H. Hamdan
(74) *Attorney, Agent, or Firm*—Piper Rudnick; Jefferson Perkins

(57) ABSTRACT

A power line testing device has a signal generator that is adapted to be connected to one of a plurality of AC branch circuits, and generates an identification signal. This identification signal will be strongest in the branch circuit of origin. A receiver of the testing device senses the strength of the identification signal, compares that strength to a stored identification signal, and is therefore able to identify to which AC branch circuit the transmitter is connected.

3 Claims, 30 Drawing Sheets

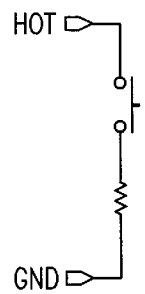
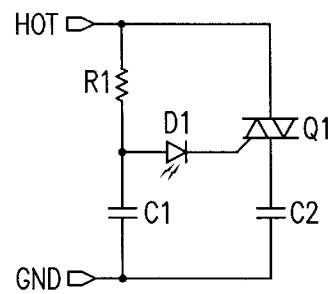
FIG. 6
(PRIOR ART)
FIG. 10
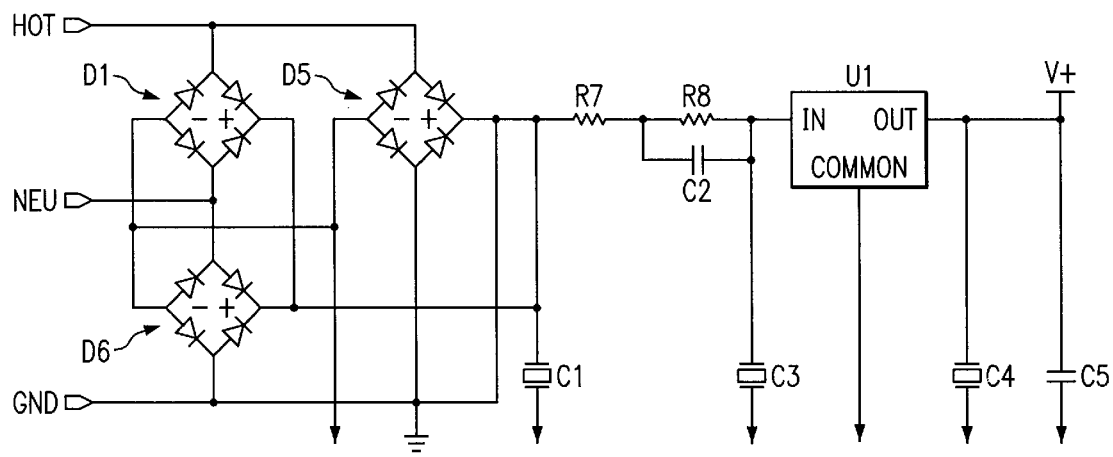
FIG. 7

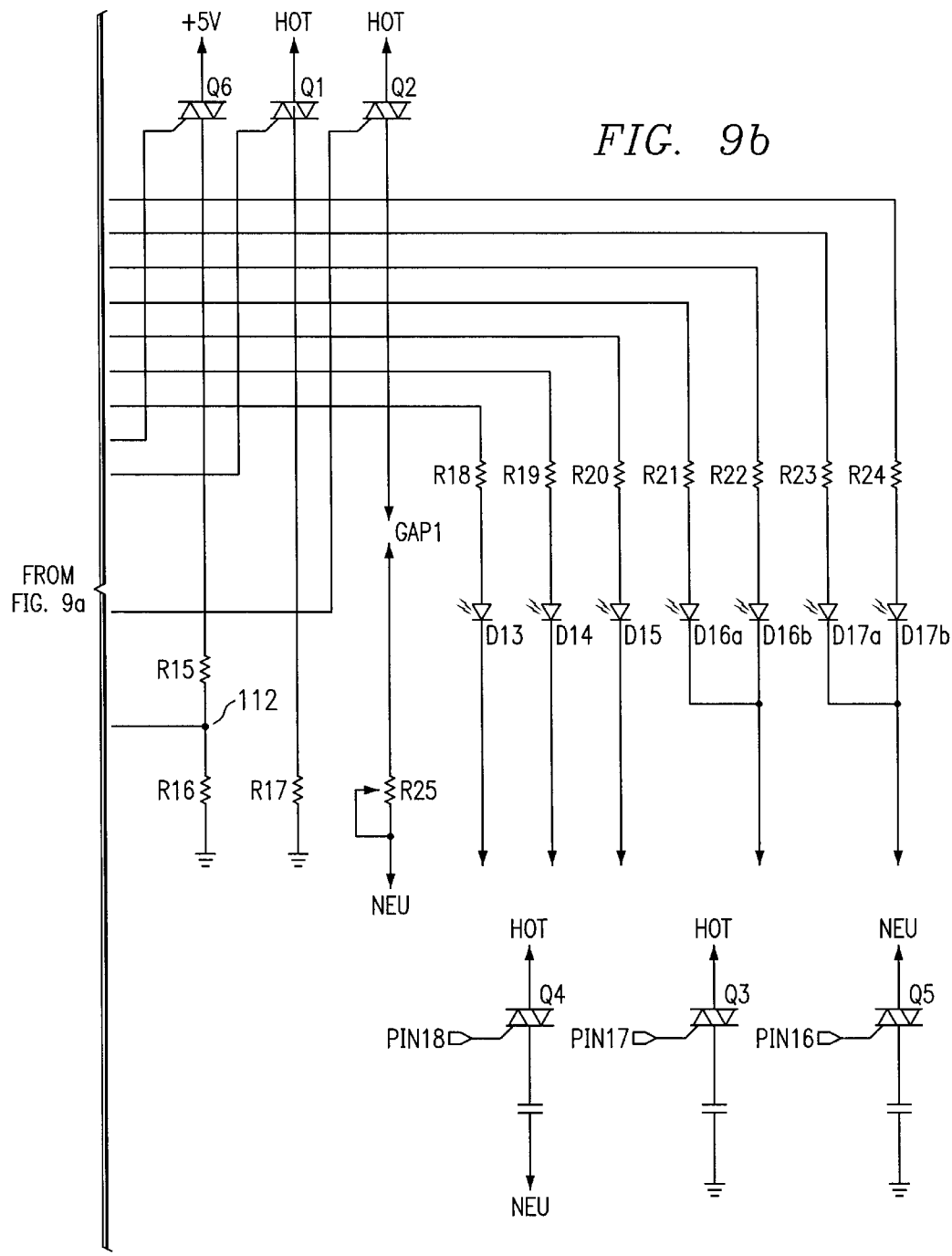

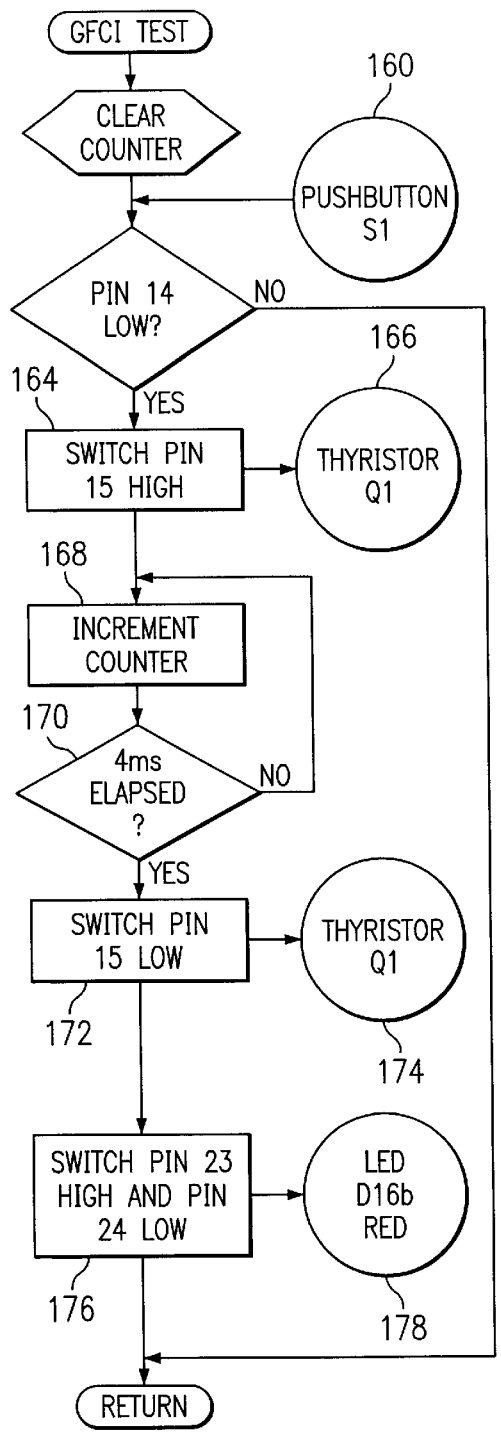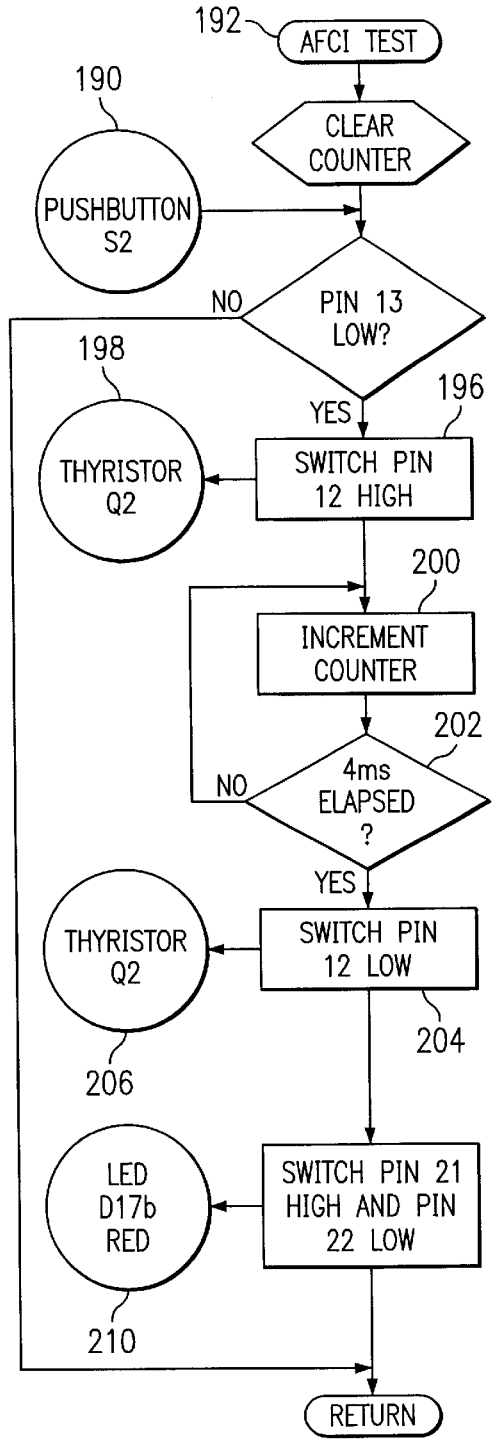

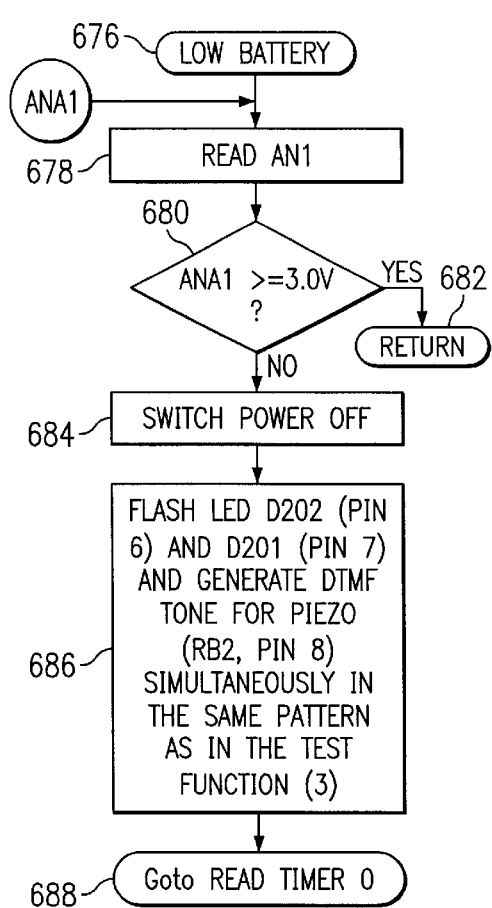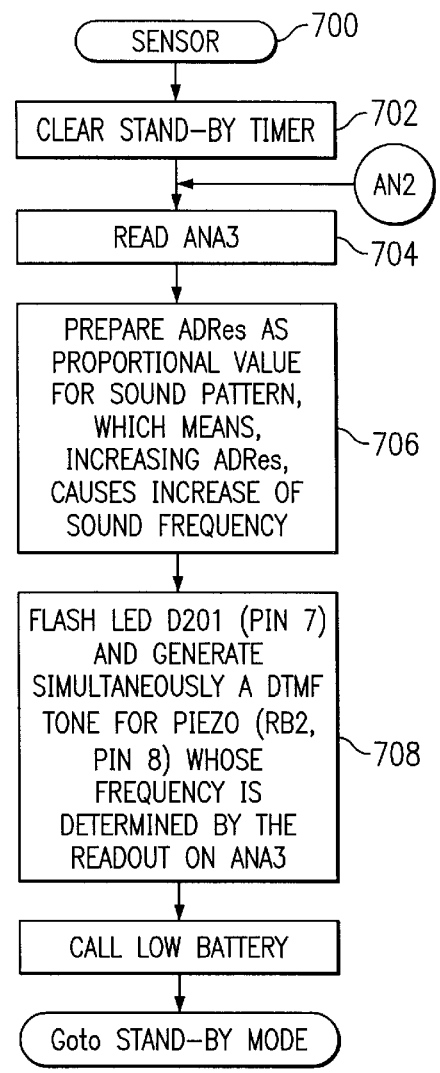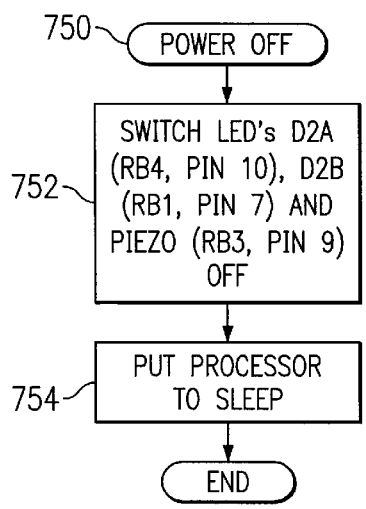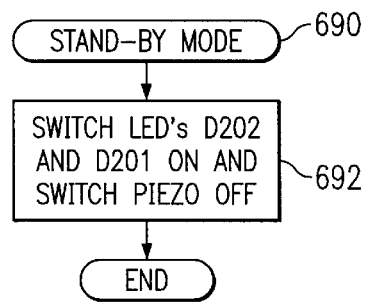
FIG. 28
FIG. 30
FIG. 31
FIG. 29

POWER LINE TESTING DEVICE WITH SIGNAL GENERATOR AND SIGNAL DETECTOR

This application claims the benefit of provisional application 60/194,726 filed on Apr. 4, 2000.

FIELD OF INVENTION

The present invention relates generally to AC power line test equipment and, more particularly, to a power line testing apparatus capable of transmitting a tracer signal easily distinguishable from environmental noise.

BACKGROUND OF THE INVENTION

When electrical power line outlets (receptacles) are installed in residential, commercial or industrial environments, it is extremely important that they are properly wired. If such outlets are incorrectly wired, they may be absolutely useless and/or can cause significant damage to equipment and property or, even worse, they can result in electrical shock, thereby possibly causing serious harm to, or death of, individuals. A further extremely hazardous situation occurs, even if the wiring scenario is correct, but where the integrity of the connected earth ground conductor is compromised. A proper ground connection is meant to shunt leakage current, which can appear at conductive enclosures of appliances due to defects or poor insulation, to earth ground. The integrity of earth ground conductors can be compromised by an increase in electrical impedance due to corrosion of conductors and/or conduits (when used as earth ground) or by degradation of conductor-to-conductor connections in commonly used wire nuts or screw terminals, which may loosen over time. If sufficient impedance is present in a ground system, the ground conductor is no longer a real earth ground.

Ground fault interrupting devices are known in the art. Those devices are usually equipped with an internal test function which works quite reliably, yet they cannot test the integrity of fixed or temporary branch circuit extensions. Therefore, numerous external testing devices have become available which are to be connected to such extensions and to perform the required test from there. Almost all known devices in this art generate a leakage current flow of a certain amount from the hot to the ground conductor, but they ignore the time that elapses until the device under test reacts. This leads in many cases to the false assumption that the device under test works properly and reliably while, in fact, in many cases it does not since the device indeed reacts, but exceeds the permissible period of time for reaction.

Fairly new in the art are so-called arc-fault interrupting devices. These devices are meant to interrupt an electrical branch circuit if serial or parallel arcing occurs along or between hot and neutral conductors in the power line system. Like ground fault circuit interrupting devices, they usually have an internal test function. In practice, there is a significant problem with these test functions because the activation of such a test is limited to either giving an incorporated microcontroller a command to activate the associated trip mechanism, or "inject" an electronic signal to the system in order to simulate arcing. As a result of the first such "test", it only gets proven that the microcontroller is "alive" and that the mechanical parts of the apparatus work properly. A second type of "test" is apparently more enhanced than the first. However, in both of these tests, there is no reliable confirmation whatever that the devices will work properly and reliably under real arcing conditions.

When work needs to be performed on an electrical branch circuit, it is first necessary to unenergize that circuit or interrupt the current flow to the circuit. This is commonly achieved by opening or unscrewing the circuit-interrupting device in the distribution panel that is associated with that particular branch circuit. In many cases, it is not known which circuit-interrupting device, out of a plurality of such devices (as commonly occurs on a panel of circuit breakers), is actually the one in question. Absolute methods of determining the correct device are often not only inconvenient and time consuming but, in many circumstances, not even feasible. A "classic" method used to find the associated device needed is to sequentially unscrew fuses or to open circuit breakers in a distribution panel until the one in question has been found. Subsequently, all outlets in the branch circuit under test need to be checked for an unenergized condition. In certain environments, such as hospitals or manufacturing plants, this or similar methods are totally impractical. In other environments (e.g. where computers without backup power are used), such methods can be, at the very least, disturbing and/or annoying. As alternatives to these methods a variety of electronic devices have been developed that accurately determine which is the particular circuit-interrupting device in question. By examining those devices, it becomes apparent that they all have significant drawbacks.

The invention disclosed in Virgilio U.S. Pat. No. 5,625,285 describes a device for monitoring the present wiring scenario and acceptable grounding properties on a standard 3-Wire 120 volt AC electrical outlet. The circuit for this device is reproduced as FIG. 2. The described device can detect and indicate the following wiring possibilities:

1. Correct wiring
2. Defective ground
3. Open neutral
4. Hot and neutral reversed
5. Hot on neutral with open neutral One of the most hazardous situations, hot and ground reversed, cannot be detected and indicated. Further, it sometimes occurs that a second hot wire is mistakenly connected to a receptacle. In such a case, the voltage across the two hot conductors is twice that of the nominal voltage. If someone intends to perform work on such a miswired circuit, he or she faces an undesirable and potentially dangerous situation, since the circuit is still energized even if one associated circuit-interrupting device has been deactivated.

In order for the Virgilio structure to analyze the integrity of the earth ground conductor, a high current pulse of short duration is drawn over the power line system. A pickup coil senses the strength of the thereby generated magnetic field. The induced voltage in the pickup coil is then used to trigger a semiconductor device, which then activates a visible indicator. This circuit requires exact calibration during the manufacturing process. If parasitic impedance is present in the ground conductor, the magnetic field loses strength, therefore the induced voltage in the pickup coil is no longer sufficient to trigger the semiconductor control device. In practice, line resistance and capacitance are subject to continuous changes due to frequent on and off switching of heavy electrical loads. This has major impact on the proper performance of that device. These line and ground impedances impact the reliability of Virgilio's ground integrity test.

Another structure, disclosed in Robitaille U.S. Pat. No. 4,929,887, describes an electrical outlet monitor that recognizes the fact that more than one hot conductor can be, possibly, connected to an outlet. However, the unit does not indicate in detail what the present wiring scenario is, but only that it is incorrect. The circuit for this unit is shown in FIG. 1.

No patented prior art is known to the applicant which covers GFCI testing devices that include the measurement and consideration of elapsed time as part of testing criteria. However, there is a device available, designed and manufactured by a German company named BEHA GmbH and distributed in North America by Greenlee which does take elapsed time into consideration.

Another structure, disclosed in Spencer et al. U.S. Pat. No. 5,875,087, describes an enhanced digital circuit breaker that includes an AFCI and an associated AFCI test function. As it is apparent from the block diagram of this breaker (FIG. 14), activation of the incorporated momentary push button 20 does not in any way introduce an actual arcing condition in the power line system under test, but rather, simply instructs the microcontroller to mechanically trip the device through D2 and thyristor 22. In effect, this is not at all a "test" of the reliability of the device to respond to a genuinely dangerous condition; it is simply a demonstration of the "desired" response to such a dangerous condition.

A structure disclosed in MacKenzie et al. U.S. Pat. No. 5,459,630 depicts an enhanced circuit breaker with incorporated GFCI and AFCI functions. It also includes a "self-test" for those two functions. This self-test function still fails to introduce an actual arcing condition to the power line system for the purpose of testing. MacKenzie et al. depicts two different ways by which the incorporated arc-fault detector can be tested. First, it generates an electronic signal with pre-determined parameters in order to electronically simulate an arcing condition, thereby forcing the arc-fault detector to respond in the desired way. Secondly, and in a nearly similar way, it generates a test signal of a different shape and takes more parameters into consideration. Here, again, there is no real or actual arcing introduced into the power line system for the purpose of testing the reliability of the AFCI.

U.S. Pat. Nos. 4,906,938 (Konopka), 5,497,094 (George), and 5,969,516 (Wottrich) all introduce devices consisting of two separate units in order to locate a particular circuit-interrupting device, among a number of such devices in an electrical distribution panel. All three devices draw a current spike over the power line system of sufficient strength and short duration that it can be used as an identification signal. The associated receivers for all three devices require manual adjustment in order to evaluate the detected identification signal in quantitative terms. None of those devices has the capability to evaluate an identification signal in terms of "quality". Power line systems are, to a great degree, polluted by numerous and various electrical signals that are generated arbitrarily, accidentally, or deliberately.

Many of those signals are sharp rising and of short duration, thereby having very similar shapes as the identification signals of the above-mentioned three devices. Since, as mentioned, those three devices do not evaluate any detected signal in terms of quality, they often get triggered by any number of polluting signals rather than by the intended identification signal. This makes those units, to a certain degree, unreliable. The technologies disclosed in U.S. Pat. Nos. 4,906,938, and 5,497,094 are of quite simple design, while the technology disclosed in Wottrich U.S. Pat. No. 5,969,516 is somewhat more enhanced. The transmitter of the Wottrich device has a wiring monitor incorporated that is, to some degree, similar to the wiring monitor disclosed in Virgilio U.S. Pat. No. 5,625,285 (as mentioned above). Furthermore, this structure is claimed to have the capability to generate an identification signal under all scenarios that are detected and indicated by the incorporated wiring monitor, except an unenergized circuit. In fact, it generates, under some wiring conditions, not only one but two identification signals. This gives rise to false identification. Practical evaluations of this device show that GFCI units, if associated with a branch circuit under test, get tripped immediately when the transmitter of this device gets connected to the electrical branch circuit.

FIGS. 11 and 12 show the schematics of two conventional devices for locating circuit-interrupting devices associated with a particular electrical branch circuit. The design in FIG. 11 is of a quite simple structure and is disclosed in U.S. Pat. No. 4,906,938. U.S. Pat. No. 5,969,516 discloses a design that is illustrated in FIG. 12. As mentioned above (prior art), this device can generate an identification signal under different wiring scenarios, yet has the drawback as depicted above.

SUMMARY OF INVENTION

The intended purpose of the herein described invention is to provide a tool, which can be used by either a professional or a layman, that allows work to be done on a power line system in the safest manner possible. This invention is an electronic testing device that includes two separate units. These units can be used independently or in conjunction with each other.

This device provides the following specific functions:

It is an AC outlet wiring monitor that analyzes and indicates the wiring scenario present in a standard power line system, testing for both correct wiring and the most common of the various incorrect wirings.

It is a self-adjusting testing unit with regards to different power line systems (110V/60 Hz, 220V/50 Hz, 440V/50 Hz), or any other situation caused by improper wiring.

It analyzes and indicates the integrity of a given earth ground system by measuring the amount of parasitic ohmic resistance.

It provides the capability to test the reliability of an associated GFCI by not only generating a leakage current across the hot and ground conductor, but also measuring the time that elapses until reaction as an essential part of the testing criteria.

It provides the capability to test the reliability of an associated AFCI by generating a real, physical, sputtering arc in the power line system while also measuring the time that elapses until reaction as an essential part of the testing criteria.

It is a device that can be used to locate a particular circuit-interrupting device (E.g. circuit breaker or fuse) associated with the particular electrical branch circuit under test. Unlike all other known units, this device does not require any manual adjustments. Also, unlike all other known units, this device analyzes the quality of the generated identification signal, in addition to the quantity, in order to avoid false indications.

It senses the presence of an electrical field in common 50/60 Hz power systems and indicates the strength of the field by increasing and/or decreasing the duty cycle of a visual and/or audible indicator.

According to one aspect of the present invention, a signal generator adapted to be placed to on a branch circuit includes a spark gap and a switch connected in series with a spark gap. When the switch is actuated, an arc will appear across the spark gap, thereby injecting an actual arcing condition into the circuit to be tested. Preferably, the switch is an optoisolator that is controlled by a logic circuit, which, in turn, is manually operated by a user.

According to another aspect of the invention, the power circuit testing device transmitter includes a transformerless power supply which can derive DC power from any AC electrical outlet, even one which is miswired, as long as one of the conductors is energized and another of the conductors provides a return path. This power supply uses full wave rectification.

According to a third aspect of the invention, a signal transmitter of a branch circuit locating system generates a signal in which the period of the signal is different from a period of an AC carrier on which the signal resides. This permits the easy identification of the signal as coming from an artificial source and makes it easy to discriminate this signal from other system conditions. In a preferred embodiment, the signal is amplitude-modulated and consists of voltage spikes on maxima and minima of the carrier wave through two cycles, with an intentional omission of such spikes on at least one following cycle. The signal generated according to the invention preferably has both negative and positive going components.

According to yet a further aspect of the invention, the power line testing device according to the invention determines the integrity of the ground connection. It does this by measuring the parasitic impedance of the ground connection. In a first embodiment of the ground integrity test function, this is done by a voltage divider. In a second embodiment of the ground integrity test function according to the invention, a phase shift is measured taking into account both real and imaginary components of the parasitic ground impedance, and the degree of phase shift of a varying signal is ascertained and compared against a stored criterion.

According to yet another aspect of the invention, the transmitter according to the invention is capable of producing a fault signal across any two of the three conductors typically found in an AC power circuit, as long as the first of those conductors is energized and a second of those conductors provides a return path.

According to yet a further aspect of the invention, a receiver of the testing system measures incoming signals over a predetermined period of time and averages signal strength. This signal strength average is compared against a stored reference in order to determine whether or not the AFCI or GFCI interrupters are correctly operating.

BRIEF DESCRIPTION OF THE DRAWINGS

FIG. 6 is a schematic diagram of a ground-fault tester used in numerous existing devices.

FIG. 7 is a schematic diagram of a transformerless power supply basic subcircuit in accordance with the present invention.

FIG. 10 is a schematic diagram of a signal-transmitting basic subcircuit in accordance with the present invention.

FIGS. 18a through 18f is a software flowchart of a signal generator in accordance with a first embodiment of the present invention.

FIG. 28 is a LOWBATTERY subroutine according to the invention.

FIG. 29 is a STANDBY subroutine according to the invention.

FIG. 30 is a flow chart of a SENSOR subroutine used in the second preferred embodiment of the invention.

FIG. 31 is a flow chart of a POWEROFF subroutine used in the invention.

In the above drawings, like characters denote like components where possible.

DETAILED DESCRIPTION OF THE PREFERRED EMBODIMENT

Signal Generator

This unit performs five different tasks:

1. It analyzes and indicates the present wiring scenario or condition on a given power outlet (receptacle) and also analyzes which one of the commonly known power line systems it is attached to (110V/60 Hz, 220V/50 Hz, 440V/50 Hz).

2. It checks for and indicates the electrical integrity of the branch circuit's "earth ground".

3. On command, it tests the reliability of a possibly associated ground fault circuit interrupter (GFCI).

4. On command, it tests the reliability of a possibly associated arc fault circuit interrupter (AFCI) by generating an actual arc across a spark gap.

5. It generates a distinct identification signal, which is sent over the power line system, allowing the below described signal detector to absolutely identify the particular circuit interrupting device associated with the branch circuit being tested.

The signal generator is controlled by a microcontroller. Since it is considered to be a "testing" device, it must work under various possible wiring scenarios that may exist on the outlet under test. Thus, the incorporated microcontroller must be powered under all these conditions. This unit is energized directly by the power present in the outlet being tested. This means that the employed power supply needs to be used, in part, three times.

The power supply schematic in FIG. 7 shows three bridge rectifiers (D1, D5, and D6) which are connected across the different conductor terminals in order to obtain DC power under various different wiring scenarios. A two-pole filter, comprised of electrolytic capacitor C1, resistors R7 and R8, capacitor C2 and electrolytic capacitor C3, is employed to smooth the pulsing DC current and to limit the applied current. A voltage regulator U1, whose output is further smoothed by capacitor C5 and electrolytic capacitor C4, follows this arrangement.

This power supply has been designed for a first herein-described unit, but is not limited for use in this application. It can be used in any other application where low voltage DC needs to be generated from a standard power line system.

Figure 8:
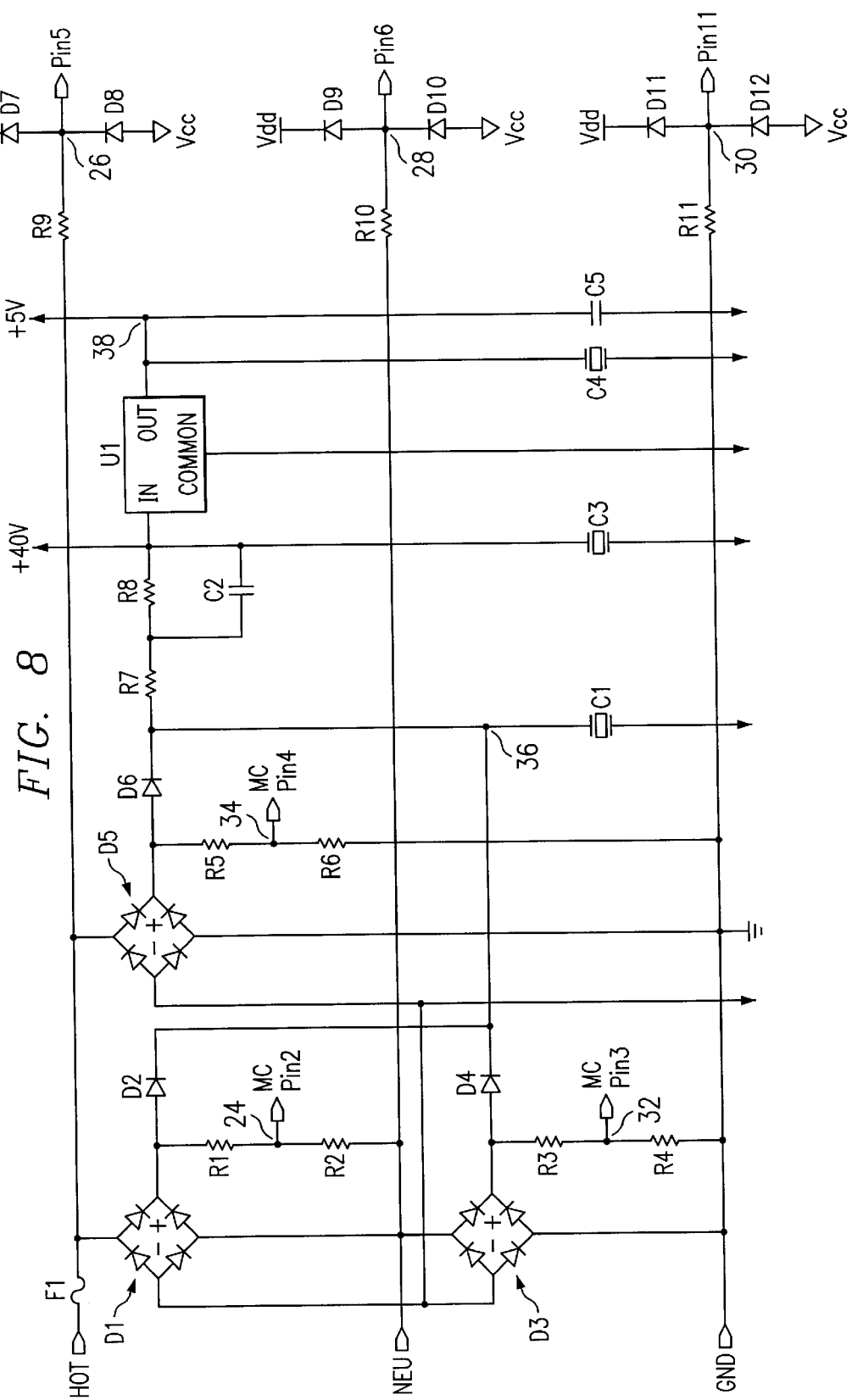
FIG. 8 is a schematic diagram of a preferred embodiment of a transformerless power supply in accordance with the present invention.
Figure 9A:
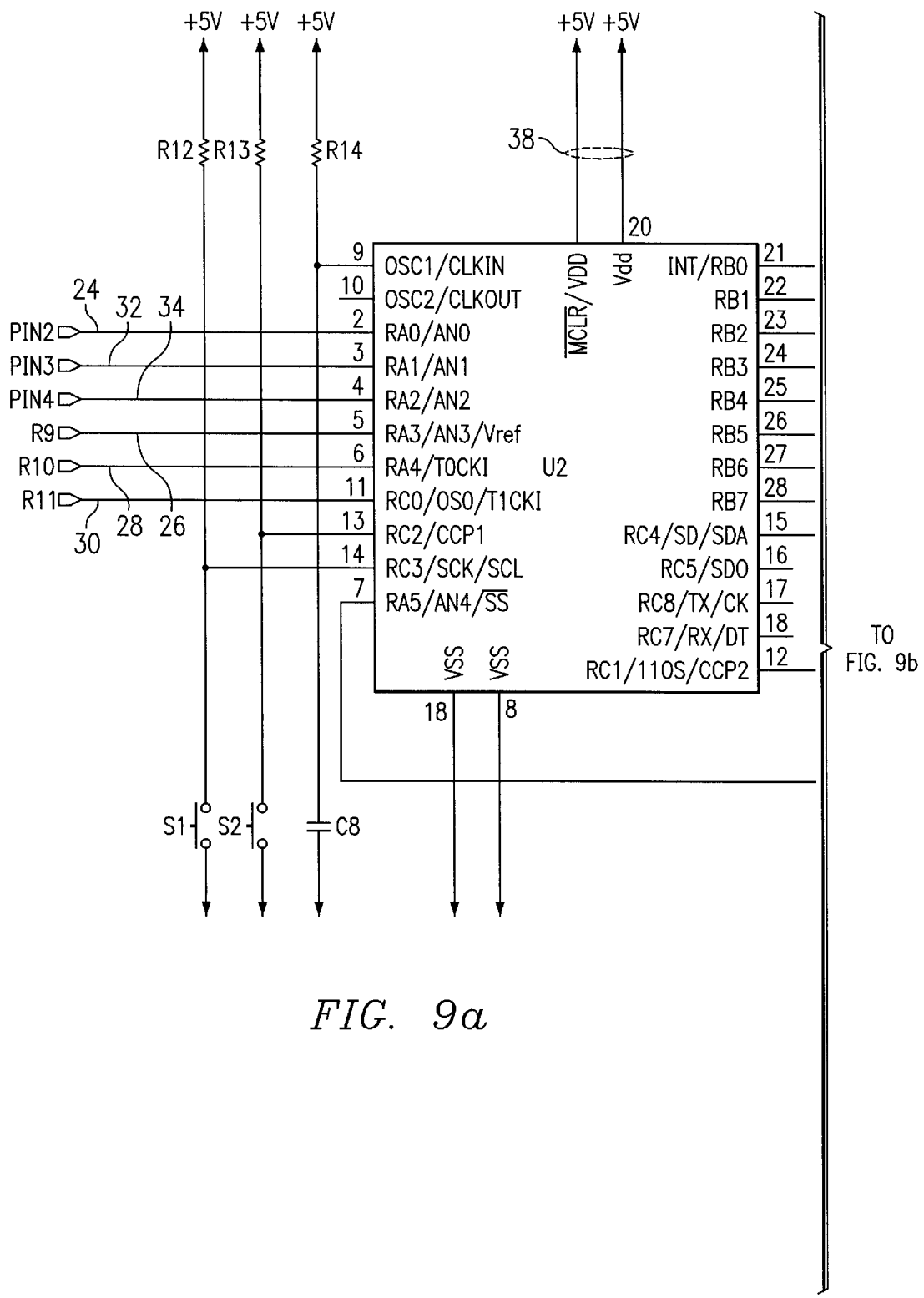
FIG. 9 is a schematic diagram of a first embodiment of the signal generator in accordance with the present invention.
Figure 11:
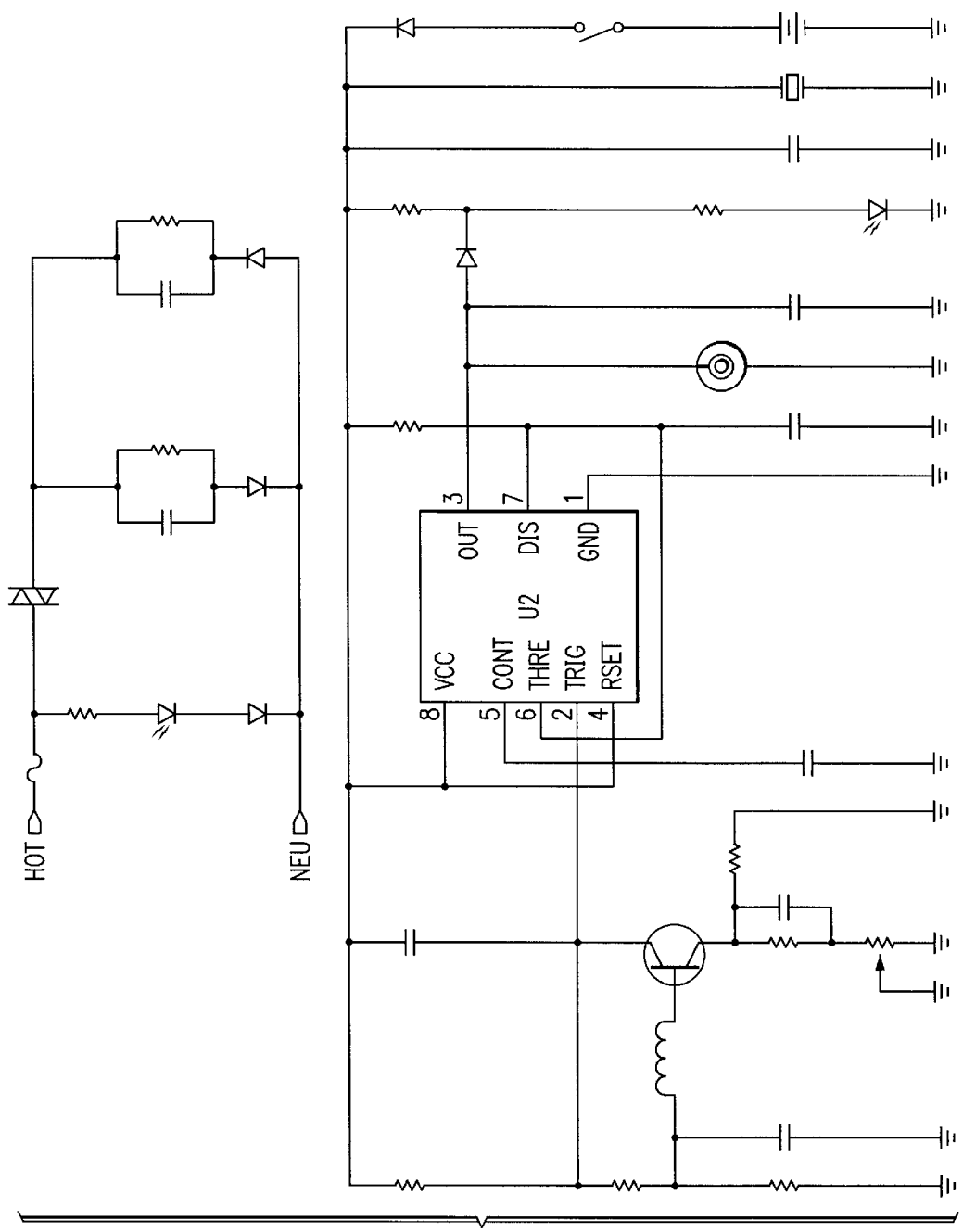
FIG. 11 is a schematic diagram of a transmitter and receiver of a conventional circuit-interrupting device locator as described in U.S. Pat. No. 4,906,938.
Figure 12:
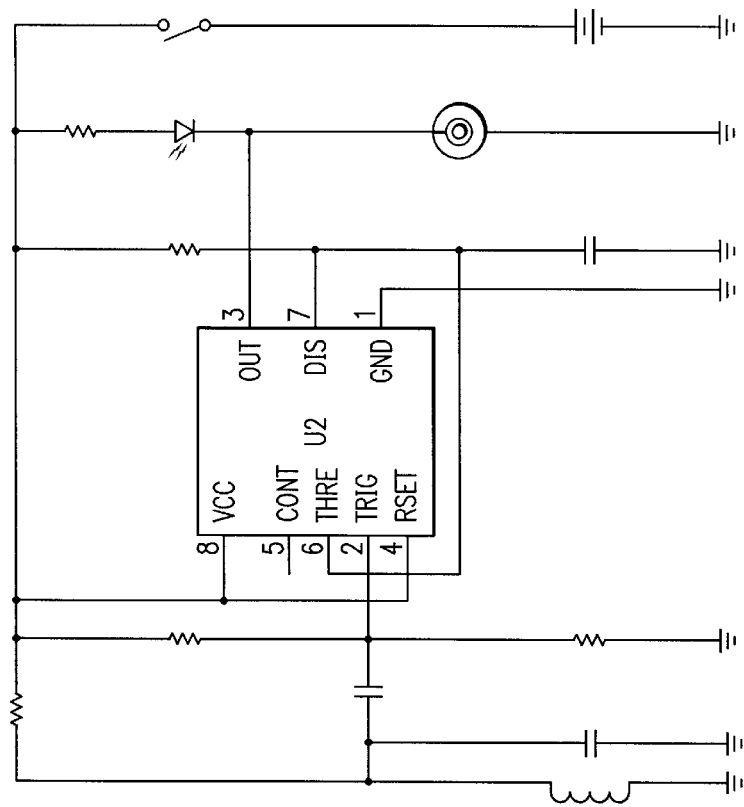
FIG. 12 is a schematic diagram of a transmitter and receiver of a conventional circuit-interrupting device locator as described in U.S. Pat. No. 5,969,516.
Figure 12:
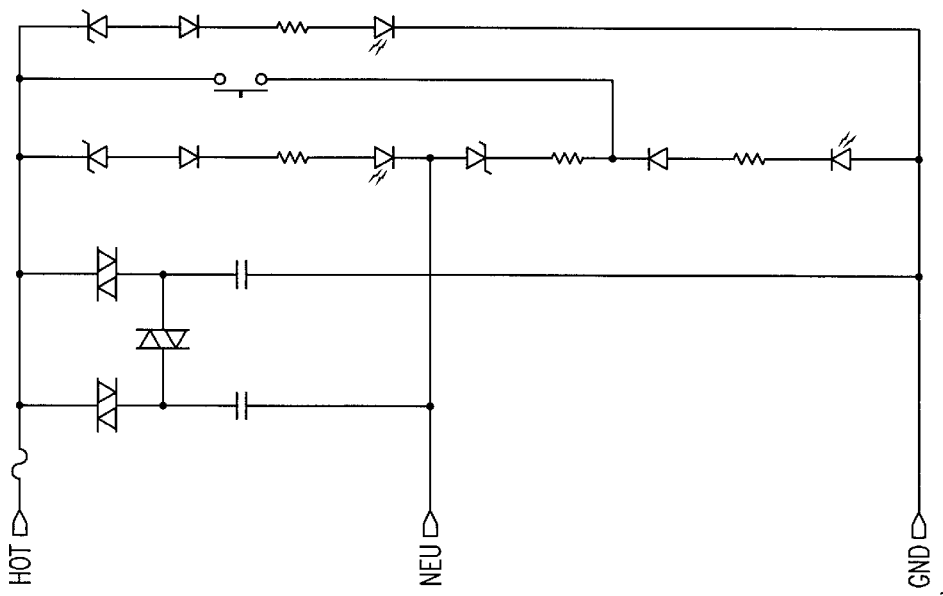

FIG. 8 shows the power supply of a first preferred embodiment of the invention. Basically, it is the same arrangement as depicted in FIG. 7, but with some additional components that are necessary in order to meet the requirements for the preferred embodiment. Three resistor networks comprised of R1/R2, R3/R4, and R5/R6 are configured as voltage dividers with a ratio of 1:100. The voltages obtained at the junctions 24,32,34 of those voltage dividers are fed to analog inputs of a PIC16C73 microcontroller U2 (FIG. 9). The junction 24 of network R1/R2 is connected to pin 2 of U2; the junction 32 of R3/R4 is connected to pin 3 of U2; the junction 34 of R5/R6 is connected to pin 4 of U2. Three additional diodes, D2, D4 and D6, are employed in order to isolate the positive path of the three power supply subcircuits from each other in order to avoid feedback from one part to another. The cathodes of those three diodes are connected together at a node 36, thereby forming the final positive supply. This positive supply is then fed through a two-pole filter (R7, R8 and C2) to a positive voltage regulator U1 for 5VDC regulated output at node 38 as described above.

The hot, neutral, and ground terminals are fed through three current-limiting resistors, R9, R10, and R11, to nodes 26, 28 and 30, which are respectively connected to digital input pins 5, 6, and 11 of microcontroller U2 (FIG. 9). In order to avoid damage to microcontroller U2, nodes 26, 28 and 30 are respectively clamped by diode pairs to Vdd and Vcc. The diode pairs are comprised of D7/D8 for node 26, D9/D10 for node 28, and D11/D12 for node 30.

In practice, it happens that conductors in power line systems build up parasitic impedance over a period of time. This is due to corrosion of material, poor mechanical connections (screw terminals), and other minor influences. If it happens in the ground conductor, this conductor is no longer a real earth ground and builds up AC current which creates potentially hazardous conditions.

Figure 1:
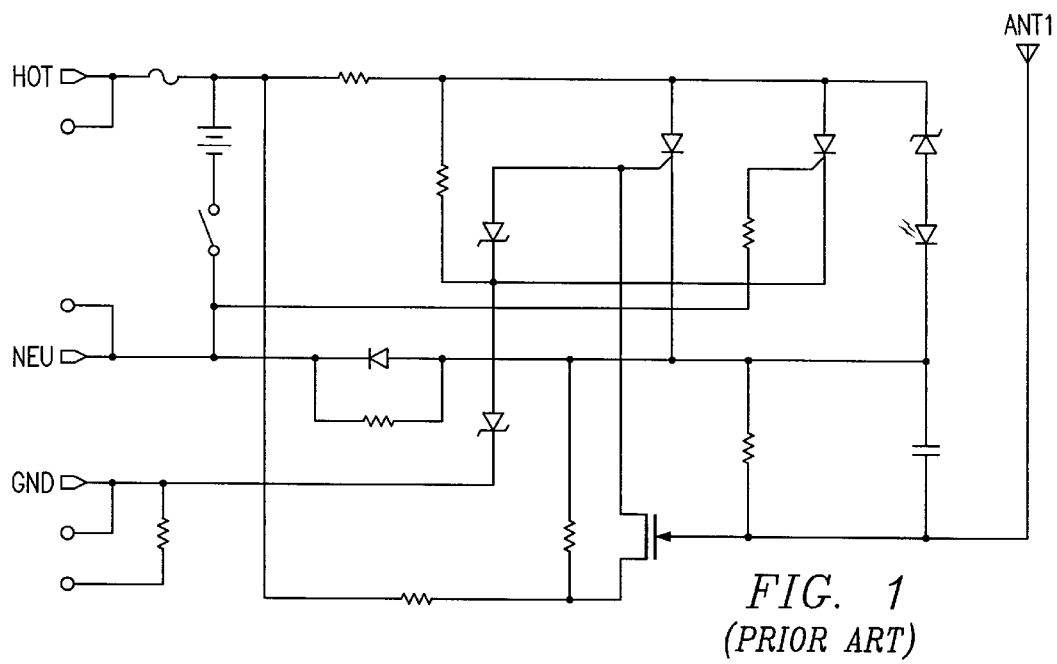
FIG. 1 is a schematic diagram of a receptacle wiring monitor as disclosed in U.S. Pat. No. 4,929,887.
Figure 2:
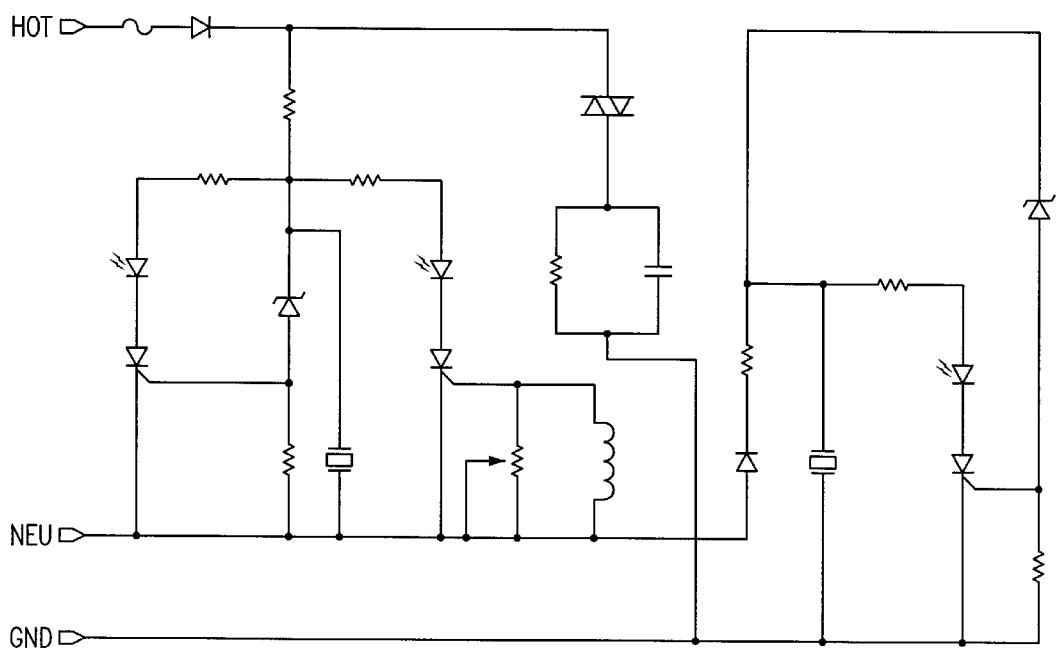
FIG. 2 is another schematic diagram of a receptacle wiring monitor and a ground integrity tester as disclosed in U.S. Pat. No. 5,625,285.

The device shown in U.S. Pat. No. 5,625,285 (FIG. 2) putatively analyzes and indicates this condition. The reliability of this technology may be questioned. Since the magnetic field which is generated by sending a high-frequency current pulse towards ground is used in order to trigger any kind of indication device, reliability suffers because of continuously changing power line impedance and capacitance.

Figure 3:
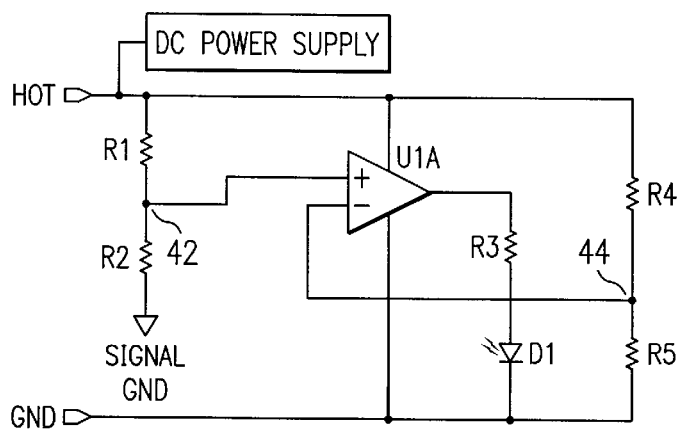
FIG. 3 is a schematic diagram of a ground integrity tester basic subcircuit in accordance with the present invention.

The circuit shown in FIG. 3 needs to be powered by DC current, therefore any kind of commonly known DC power supply—which uses a bridge-rectifier in order to obtain a separate signal ground different from earth ground—can be used. In the illustrated embodiment a general-purpose operational amplifier (op amp) U1A is configured as a voltage comparator. A resistor network comprised of resistors R1 and R2 forms a slightly unbalanced voltage divider that provides the half of the supply voltage plus an additional 1% of the supply voltage on the junction 42 between those two resistors. This voltage is fed to the non-inverting input of the operational amplifier U1A. Another balanced voltage divider, comprised of resistors R4 and R5, provides exactly the half of the supply voltage on the junction 44 between those two resistors. This voltage is fed to the inverting input of the operational amplifier U1A. If parasitic resistance is present in the ground conductor, it adds on to resistor R5, thereby forcing the voltage divider out of balance. This results in an increase of the voltage at junction 44. If this voltage rises above the voltage on the non-inverting input of the operational amplifier (node 42), then the output of the op amp U1A goes high and lights LED D1 through current-limiting resistor R3. This alert makes the user aware of improper grounding conditions. An advantage of this approach is that since this technique is based on pure resistive (ohmic) testing, neither changes in power line inductance or capacitance, nor any accidentally present high-frequency signals, have any impact on the result.

Ground-fault circuit interrupting devices (GFCI) are widespread in the marketplace. Even though these devices are equipped with an internal test function, a variety of other testing devices for GFCIs are available. FIG. 6 shows an example of an electronic circuit as it is utilized in most of the existing GFCI testers. A leakage current flows from hot to ground through current-limiting resistor R1 if push-button S1 is activated. The value of resistor R1 is chosen so that a leakage current in range between 6 and 9 mA flows to ground. This method is reliable, yet totally ignores consideration of the time elapsed until a GFCI reacts.

Figure 4:
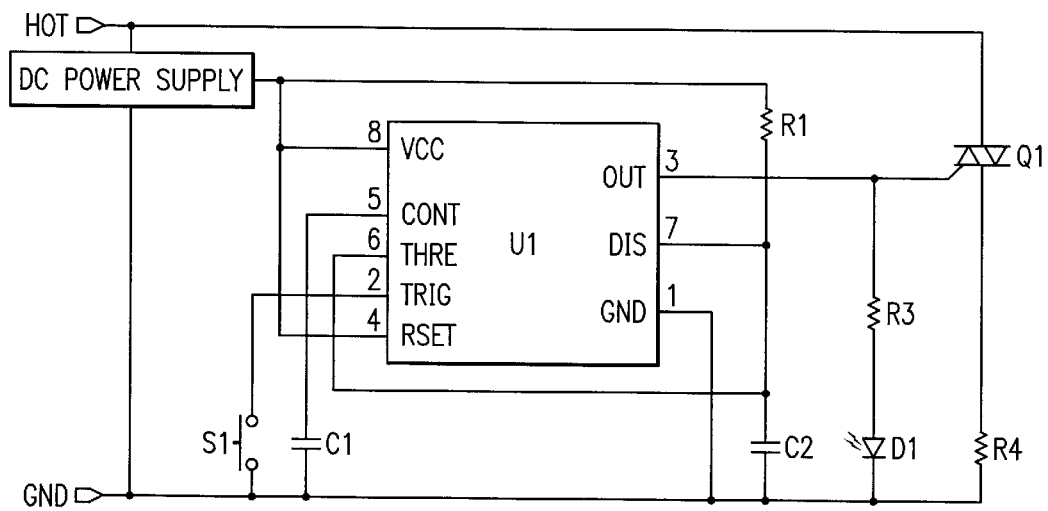
FIG. 4 is a schematic diagram of a ground-fault tester basic subcircuit in accordance with the present invention.

FIG. 4 shows an arrangement that remedies this problem. In the same manner as mentioned above, any common DC power supply can be used in order to energize the circuit shown in FIG. 4. A versatile 555 timer (U1) is configured as a monostable multi-vibrator, in which resistor R1 in series with capacitor C2 are the time determining components. Capacitor C1 is not really necessary, but helps to give the circuitry better stability. If pushbutton S1 gets activated, then timer U1 switches its output (pin3) high. This lights LED D1 through current-limiting resistor R2 and also triggers thyristor Q1 into conduction. When thyristor Q1 is conductive, a current flows through current-limiting resistor R4 from hot to ground in the same manner as in commonly-known GFCI testers (see above). If a predetermined time (R1, C2) elapses, then timer U1's output goes low, thereby deactivating thyristor Q1 and so terminating the current flow from hot to ground. Furthermore, since U1's output goes low, LED D1 no longer lights. This is the indication that the attempted test has failed.

Figure 14:
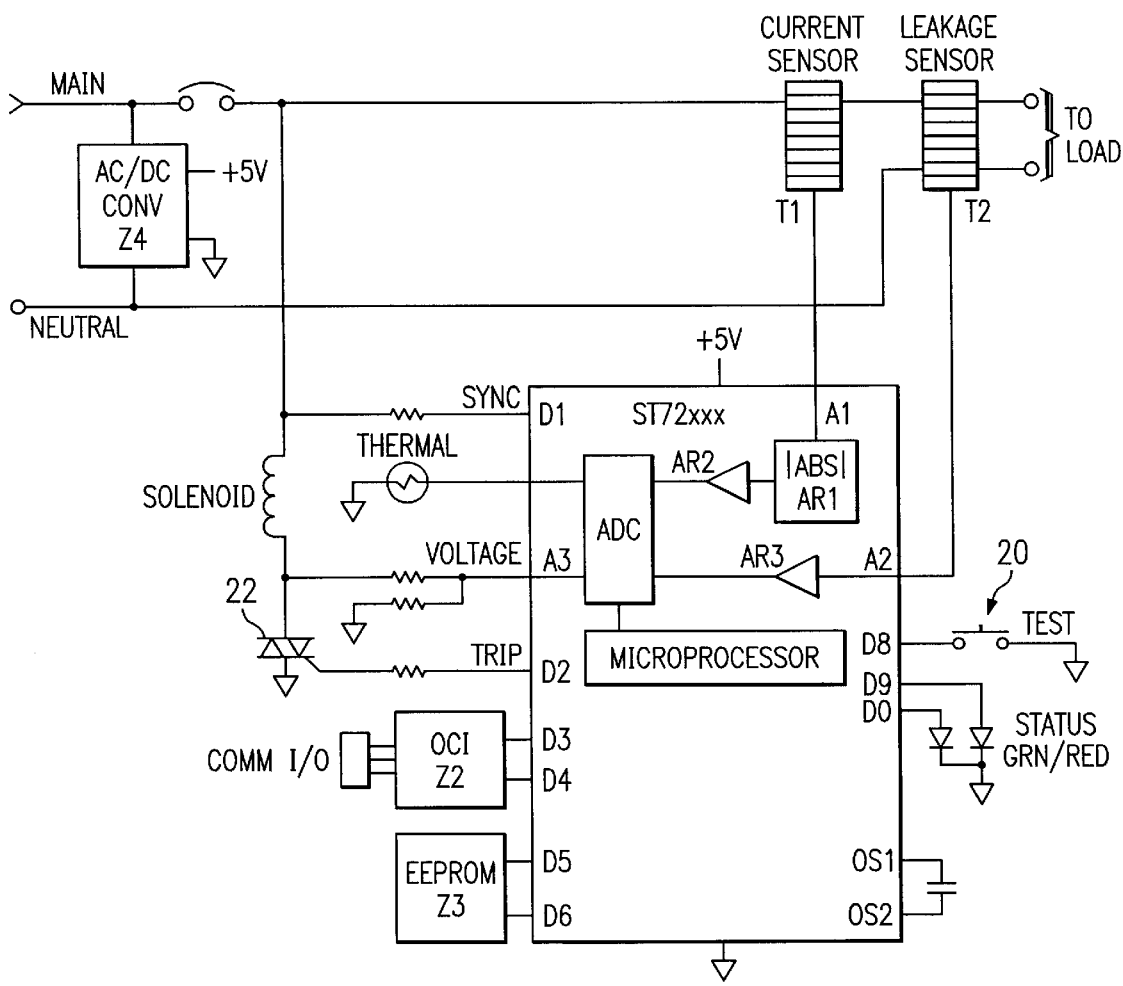
FIG. 14 is a block diagram of a conventional arc fault interrupting device as described in U.S. Pat. No. 5,875,087.
Figure 15:
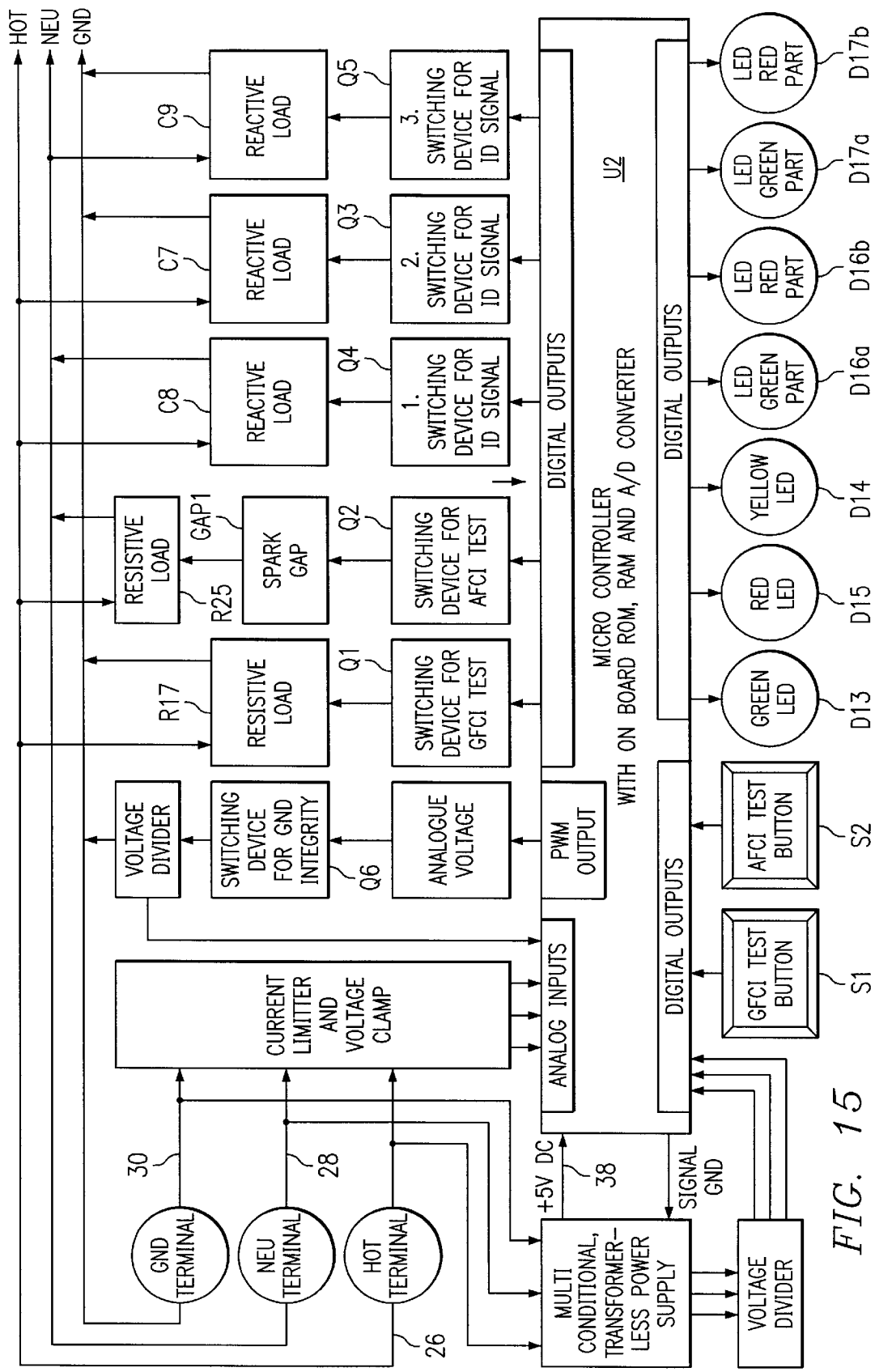
FIG. 15 is a block diagram of the signal generator in accordance with the present invention.
Figure 16:
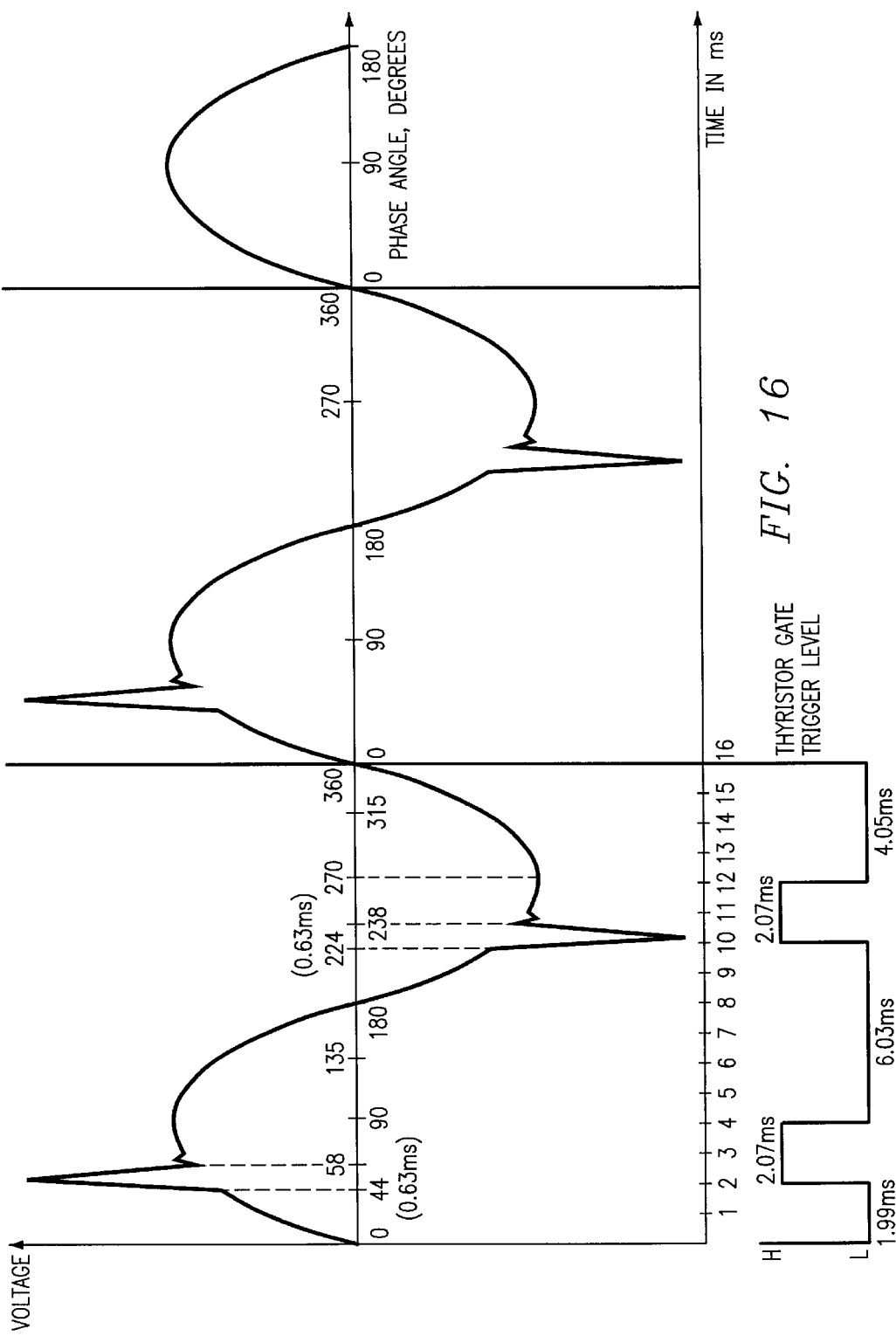
FIG. 16 is a graph of voltage versus time of a preferred identification signal generated in accordance with the present invention.
Figure 17:
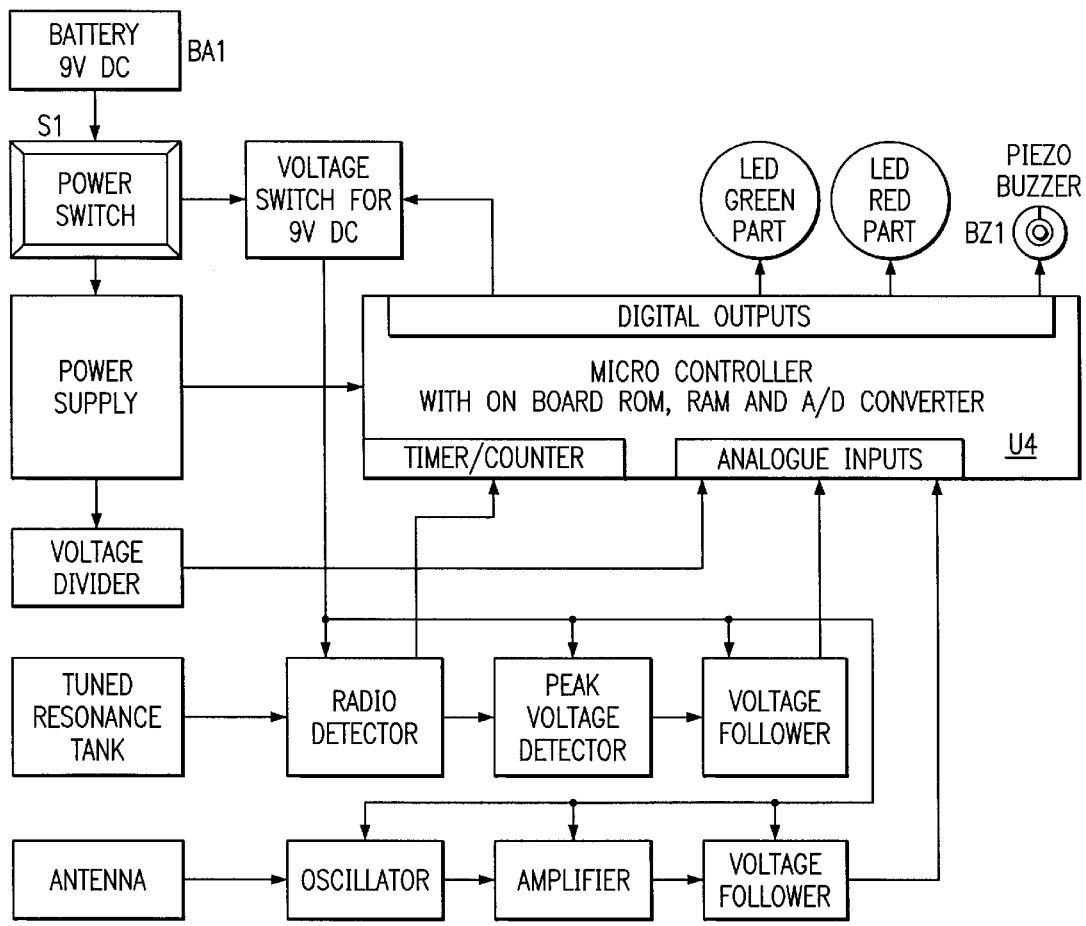
FIG. 17 is a block diagram of the signal detector in accordance with the present invention.

There have been arc-fault breakers for only a short period of time in the marketplace. Those devices are also equipped with an internal "test function". The way this "test function" works is that the incorporated microcontroller recognizes that a test is requested and, therefore, activates one of its outputs in order to trip the breaker. This certainly gives an indication that the mechanical part of the breaker works properly, but it does not by any means indicate whether or not the unit would react reliably if an actual arcing condition were present or introduced to the power line system. The block diagram shown in FIG. 14 shows such a design as it is disclosed in U.S. Pat. No. 5,875,087.

Figure 5:
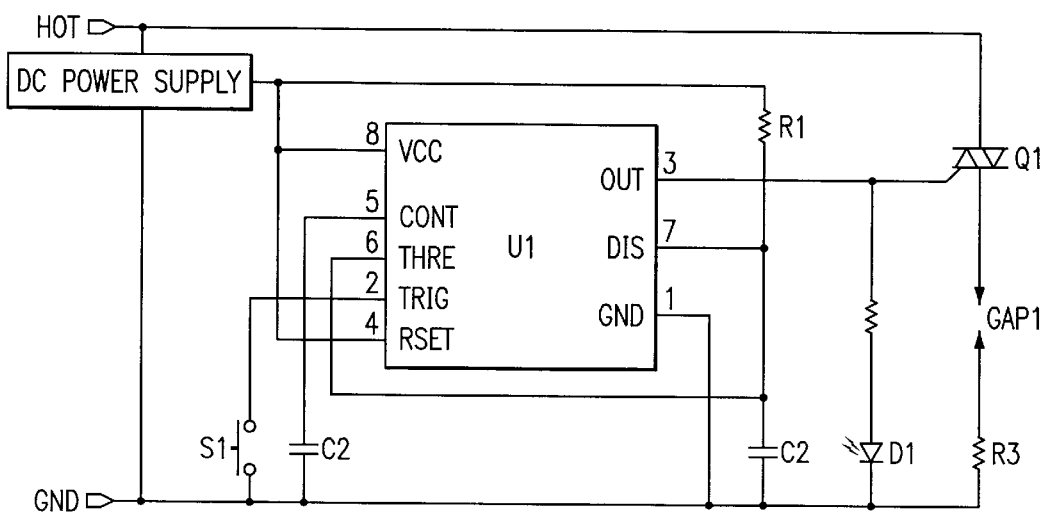
FIG. 5 is a schematic diagram of an arc-fault tester basic subcircuit in accordance with the present invention.

FIG. 5 shows a schematic diagram of a circuit according to the invention which indeed causes actual controlled arcing in the power line system. The circuit illustrated in FIG. 5 is similar to the circuit shown in FIG. 4. However, in the current-drawing path of the circuit comprised of thyristor Q1 and current-limiting resistor R3, a spark gap GAP1 has been employed to cause real arcing in the system.

Numerous devices are also available in the marketplace for locating a particular circuit breaker in a distribution panel. All those devices consist of two separate units, usually referred to as transmitter and receiver. The device of the invention also includes two separate units. There are, however, significant differences between the two unit device of the invention and the known prior art. Those differences will be described in greater detail further below. FIG. 10 shows a design of a signal generator that generates a very strong identification signal over the power line system in order to be detected by the later-described signal detector. Resistor R1, in series with capacitor C1 connected across the hot and neutral conductors of a power line system, forms a phase-shifting network that serves the purpose of activating thyristor Q1 through trigger diode D1. An LED has been chosen as the trigger diode. The LED D1 will light during triggering, thereby indicating to the user that the device is active. The electrical values of resistor R1 and capacitor C1 determine at what electrical phase angle triac Q1 goes into and out of conduction. When Q1 becomes conductive in the positive half-cycle of the sine wave, capacitor C2 (with a large electrical value) gets charged instantly to the peak voltage level. This causes the appearance of a very strong electromagnetic field that surrounds the power line. When capacitor C2 (FIG. 8) is fully charged, thyristor Q1 (FIG. 9) goes out of conduction. During the negative half-cycle of the power line sine wave, the same sequence is repeated but with opposite polarity, thereby discharging capacitor C2 instantly and causing the appearance of an electromagnetic field again. The electromagnetic field is of sufficient strength to be detected later by the signal detector.

The preferred embodiment of the invention uses all above-mentioned subcircuits (FIGS. 3, 4, 5, 7 and 10), with certain changes, in order to meet the particular needs of the final design. FIG. 8 shows a schematic of the power supply for the preferred embodiment's signal generator.

Microcontroller U2 (FIG. 9), preferably a Microchip PIC16C73, is the core of the first preferred design. Any other microcontroller that has similar performance capabilities can be used. Microcontroller U2 has its own oscillator, power-on reset circuit (POR), ROM- and RAM memory on board. Therefore, only an RC network, consisting here of resistor R14 and capacitor C6, connected to pin 9 of U2, is necessary to obtain the operating clock for the microcontroller U2. With the selected values for R14 and C2 (5 KΩ and 20 pf, respectively) and an operating voltage of 5VDC, microcontroller U2 runs with an operating speed of approximately 4.12 MHz. Pin 1 (/MCLR) is connected directly to the 5V power supply since no additional circuitry is needed for POR. Digital input pins 13 and 14 are. held by respective pull-up resistors R12 and R13 to +5VDC. Two momentary push buttons (S1 and S2) are employed in order to pull those input pins (13 and 14) to signal ground in order to indicate to microcontroller U2 that a particular task is required. The activation of switch S1 requires the task of performing a GFCI test, while the activation of switch S2 requires the task of performing an AFCI test.

Figure 18A:
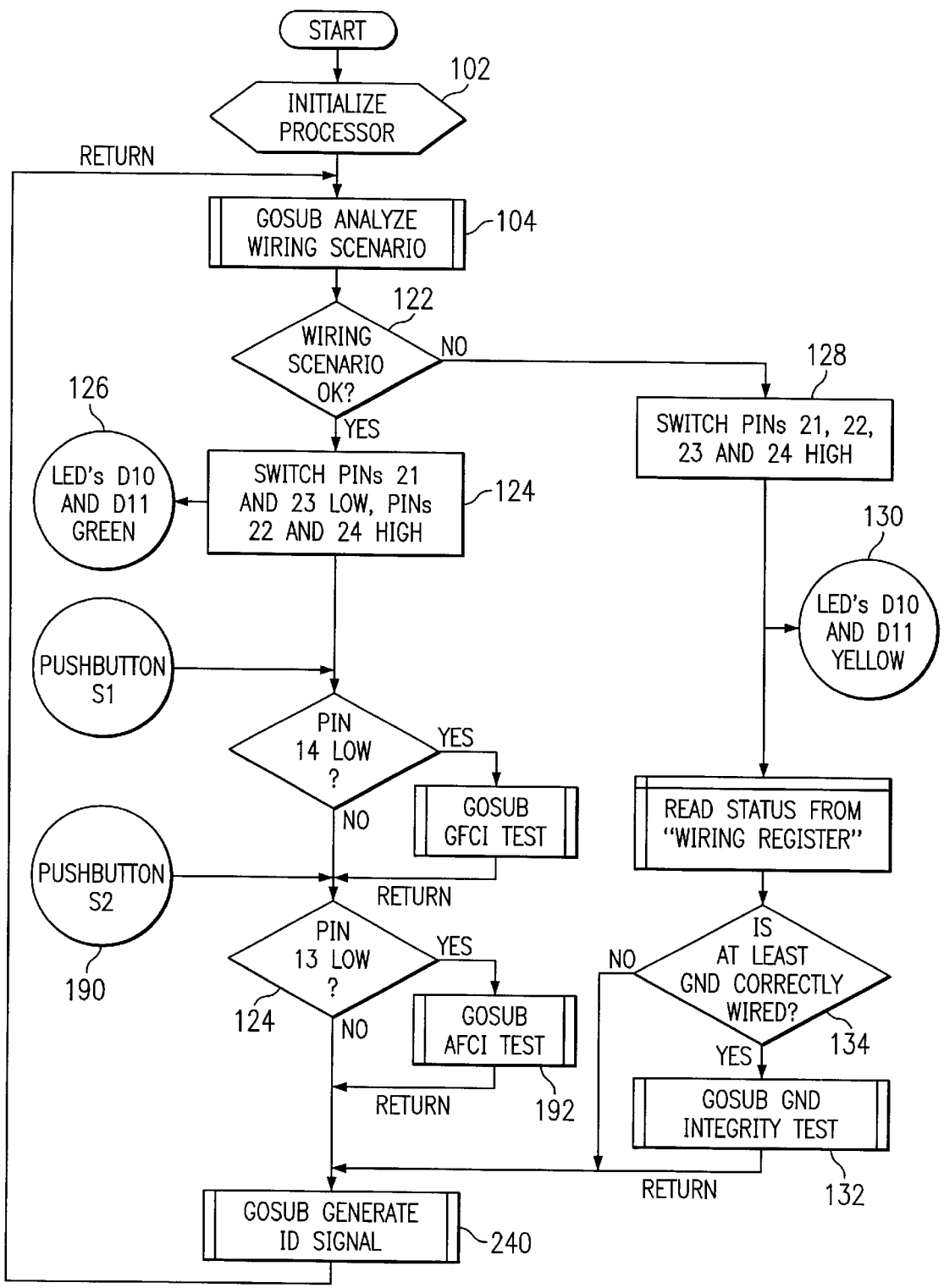

The functionality of microcontroller U2 is shown in flowchart form in FIGS. 18a–18f. Referring to FIG. 18a, the microcontroller U2 at step 102 initializes and configures itself in accordance with values that are set in the software. Then, at subroutine 104 (FIG. 18b) it reads the values, as they are present, on its analog input pins 2, 3 and 4, respectively connected to voltage divider nodes 24, 32 and 34 (FIG. 8). By reading the voltages present on those analog input pins, the type of branch circuit connected to the unit can be evaluated (E.g. 110V, 220V, or 440V). Furthermore, it is possible to analyze the wiring scenario or condition present at the receptacle where the device is connected. If a voltage is present on pins 2 and 4 of U2, but not on pin 3, the wiring condition is correct. If voltage is present on pin 2 only, then the ground conductor is not connected. If voltage is present on pin 4 only, then the neutral conductor is not connected. If voltage is present on pins 2 and 3, but not on pin 4, then the hot and neutral conductors are reversed. If voltage is present on pins 3 and 4, but not on pin 2, then the hot and ground conductors are reversed. If voltage is present on pin 3 only , then the hot conductor is connected to the neutral terminal and the neutral conductor is not connected at all. If voltage is present on all three analog input pins (2, 3, and 4), then it is apparent that two hot conductors (two different phases) are connected to the outlet terminals. If the voltage on pin 2 is the double of the voltages on pins 3 and 4, then two hot conductors are connected to the hot and neutral terminals in the outlet. If the voltage on pin 3 is the double of the voltage on pins 2 and 4, then two hot conductors are connected to the neutral and ground terminals in the outlet. If the voltage on pin 4 is the double of the voltages on pins 2 and 3, then two hot conductors are connected to the hot and ground terminals in the outlet. The result of this analysis will be stored in an internal register of microcontroller U2 aptly named "wiring register".

Voltage present in any terminal of the outlet can also be read by the microcontroller U2 on its digital input pins 5, 6, and 11. This is done at steps 106, 108 and 110 in FIG. 18b. If voltage is present on. any of those three input pins, but it falls periodically below 2V (logical low), then zero crossing of the power line's sine wave cycle has been detected. If this is the case, then microcontroller U2 starts immediately to count the time that elapses until another zero crossing is detected. If this time is approximately 8 ms, then a 60 Hz cycle is present. If this time is approximately 10 ms, then a 50 Hz cycle is present. The result of this evaluation is also stored in an internal register of U2 named "frequency register". The evaluation of the frequency is necessary in order to provide the capability for microcontroller U2 to select the appropriate software part so that correct timing is established for the generation of the below-described identification signal.

In the next task (FIG. 18a), the signal generator unit checks the electrical integrity of the ground conductor at subroutine 132 if (as determined at decision 134) a hot conductor is not connected to the ground terminal of the outlet. If a hot conductor is mistakenly connected to the ground terminal of the outlet, then this task will be skipped and microcontroller U2 continues with other tasks as described below. The ground integrity test subroutine is shown in FIG. 18e. In order to check the integrity of the ground conductor, at step 136 microcontroller U2's output pin 15 goes high, thereby triggering the gate of logical triac Q6. This causes current flow from +5V to ground through resistors R15 and R16 (FIG. 9). Those two resistors form a balanced voltage divider whose junction 112 is connected to microcontroller U2's analog input pin 7. If the ground system is not compromised, then the voltage present on pin 7 of U2 is exactly the half of the supplied 5VDC. If, due to material corrosion, poor mechanical connections (screw terminals), or other impacts, parasitic resistance is present in the grounding system, then this parasitic resistance adds on to resistor R16. If this is the case, then the voltage divider (R15/R16 plus parasitic resistance) becomes unbalanced and the voltage on its junction 112 increases. If the degree of imbalance exceeds a stored threshold value which is equivalent to a predetermined resistance (such as 4 Ω), the program will declare that the ground lacks sufficient integrity. The purpose of checking the integrity of the ground system is to make the user aware of a potentially hazardous condition, since the connected ground conductor is not a real earth ground which means that fairly high AC voltage can be present in the ground conductor.

Figure 18B:
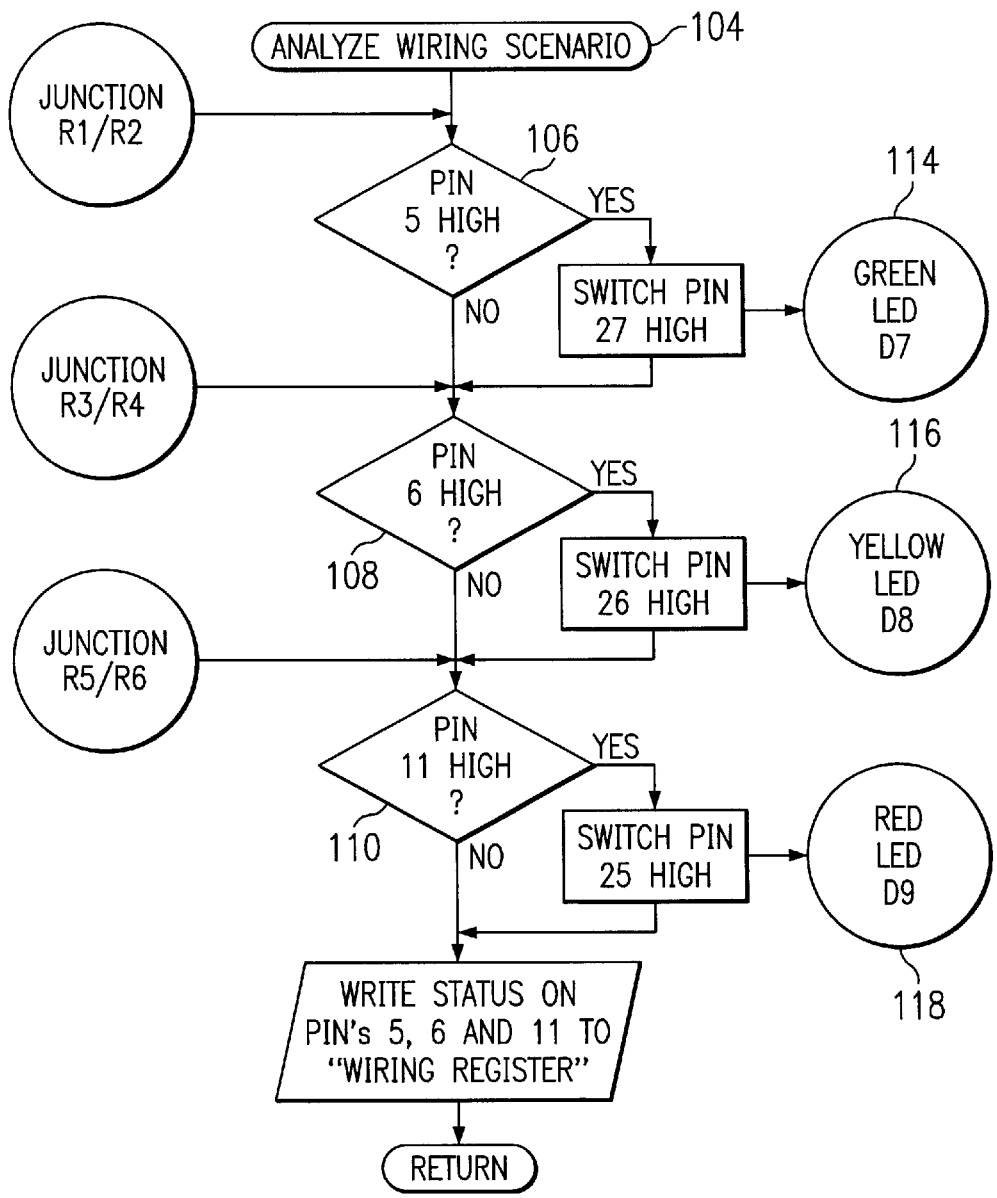
Figure 18E:
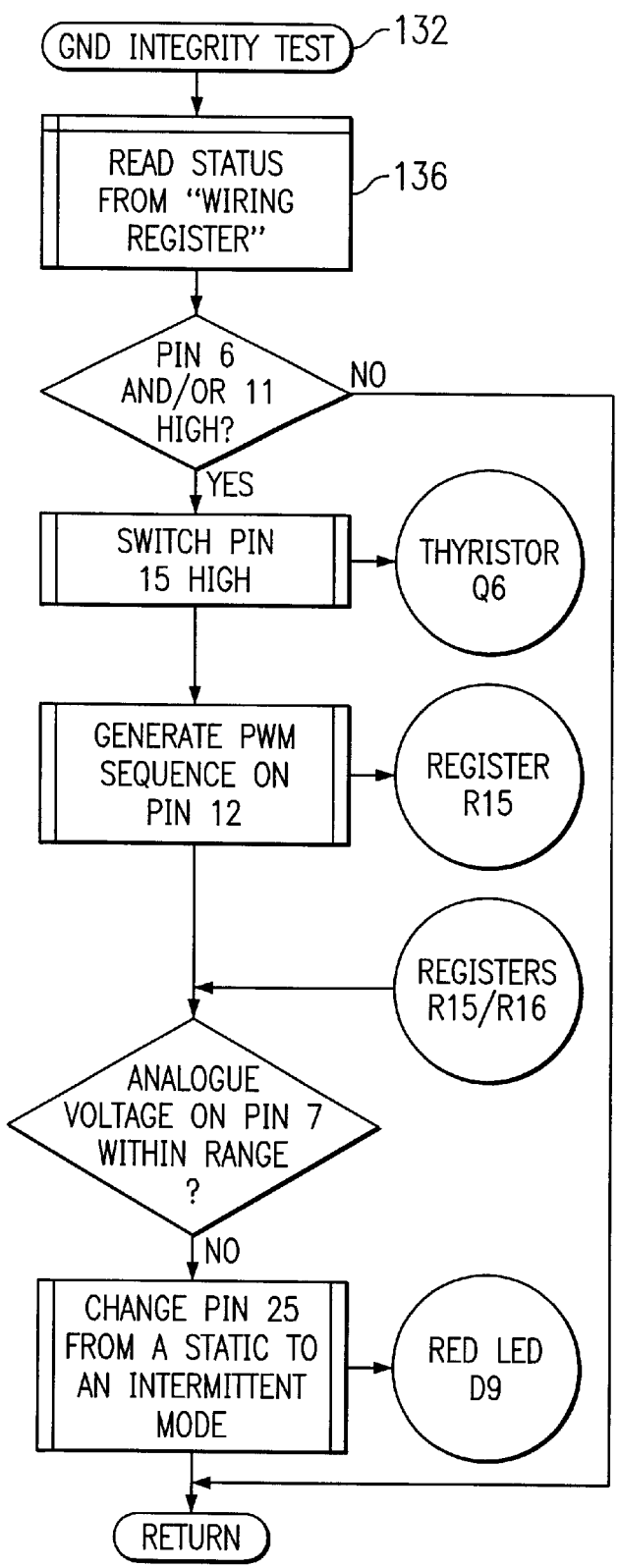
Figure 18F:
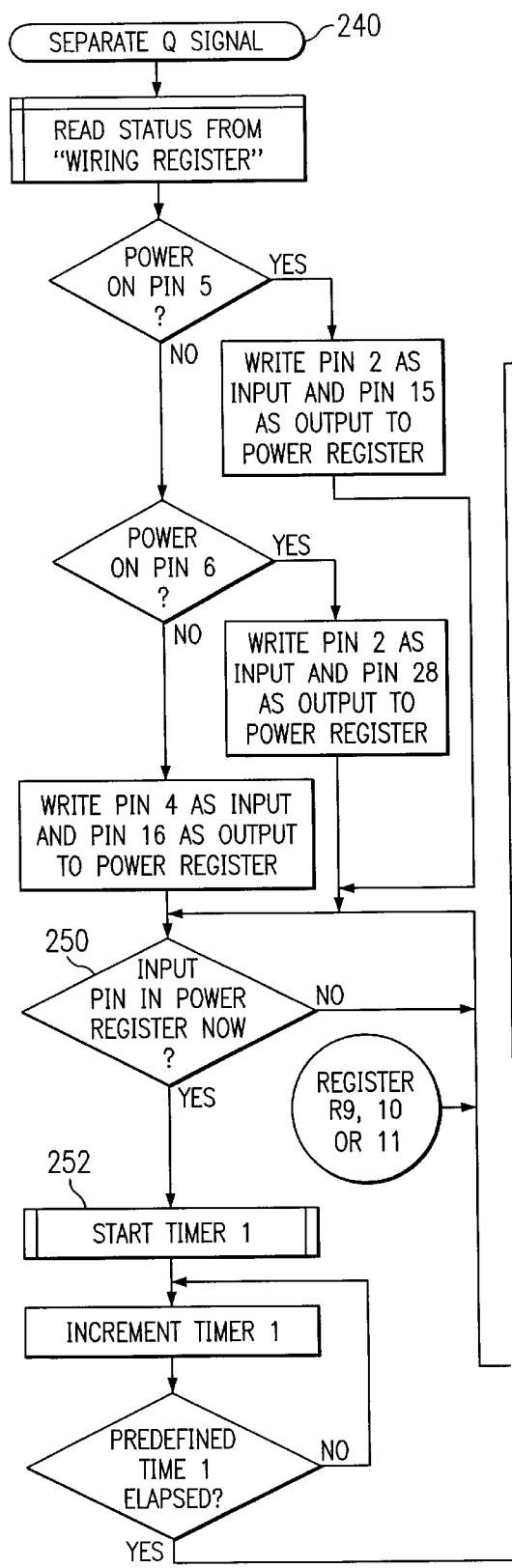
Figure 18F:
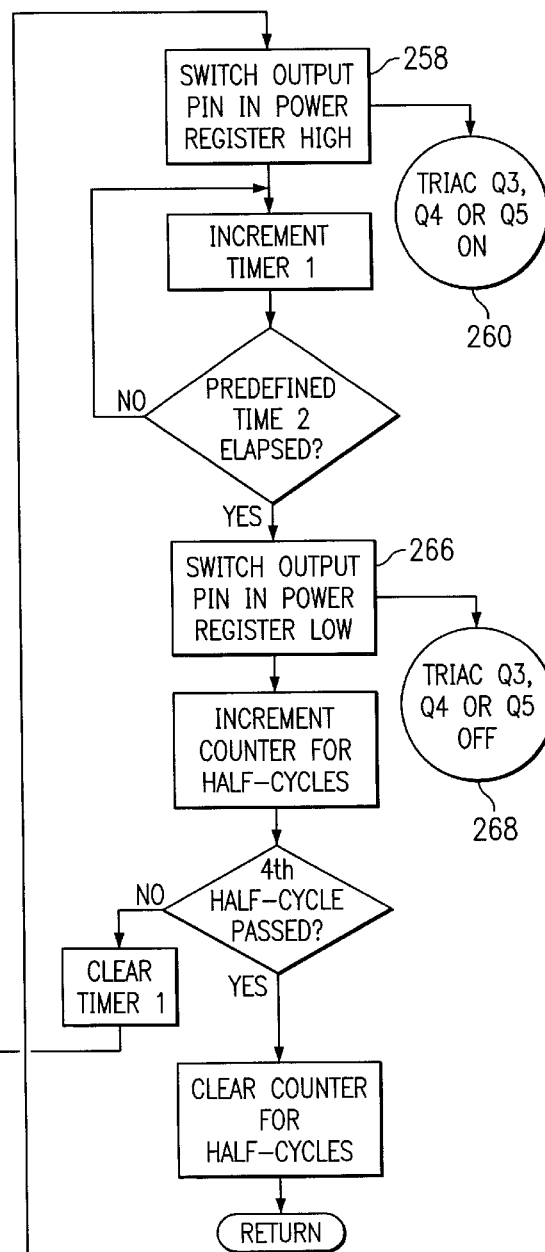

In the next task, all results of the above-described tasks will be displayed in distinct patterns at the incorporated LEDs D7, D8, and D9 (steps 114, 116 and 118 in FIG. 18b). Table 1 below illustrates the different lighting sequences of those three LEDs in accordance with the results of the above-described analyses.

TABLE I

| | GREEN LED D7 | YELLOW RED D8 | RED LED D9 |
|---|---|---|---|
| 1. Correct wiring with fully functioning earth Ground | ON | ON | OFF |
| 2. Correct wiring but with earth Ground compromised | ON | FLASHING | OFF |
| 3. Open Ground | ON | OFF | OFF |
| 4. Open Neutral | OFF | ON | OFF |
| 5. Reversed Hot and Neutral | ON | OFF | ON |
| 6. Reversed Hot and Ground | OFF | ON | ON |
| 7. Hot on neutral with open neutral wire but an intact ground | OFF | OFF | ON |

TABLE I-continued

| | GREEN LED D7 | YELLOW RED D8 | RED LED D9 |
|---|---|---|---|
| 8. Hot on neutral with open neutral wire but compromised ground | OFF | FLASHING | ON |
| 9. Two hot wires on the hot and neutral terminal | FLASHING | FLASHING | OFF |
| 10. Two hot wires on the hot and ground terminals | OFF | FLASHING | FLASHING |
| 11. Two hot wires on the neutral and ground terminals | ON | FLASHING | FLASHING |
| 12. Unenergized circuit | OFF | OFF | OFF |

The unit is equipped with the capability to perform a reliability test of an eventually associated GFCI and/or an eventually associated AFCI. Those tests are useful only if the present wiring scenario is correct. If at step 122 (FIG. 18a) this is the case, then at step 124 the two incorporated dual color LEDs, D10 and D11 (FIG. 9, step 126 in FIG. 18a), will be lit in green, thereby indicating to the user that the two test functions are available. If the wiring scenario is not correct for any reason, then at steps 128 and 130 LEDs D10 and D11 will be lit in yellow, thereby indicating to the user that those two test functions are not available. If the user still tries to activate either of the two tests by pushing the momentary push buttons S1 or S2, then microcontroller U2 will ignore this request and will light either LED D10 (S1) or LED D11 (S2).

If the two test functions are available and at step 160 (FIG. 18c) the user activates momentary push button S1 (for the GFCI test), then microcontroller U2's output pin 15 goes high at step 164, thereby (at 166) triggering the gate of thyristor Q1, thus allowing a current flow from hot to ground through current-limiting resistor R17. This current will be in the range required by appropriate authorities for the performance of GFCI tests. At the same time output pin 15 goes high, at step 168 microcontroller U2 starts an internal timer with a resolution of 0.1 ms. If a predetermined time (such as 4 ms.; step 170) elapses (times out) from the time momentary push button S1 is activated, then at step 172 the test function will be terminated by switching output pin 15 low, turning off thyristor Q1 at 174, and at step 176 LED D16b will be lit in red (step 178) in order to indicate to the user that the GFCI unit being tested has failed.

If at step 190 (FIG. 18a) the user activates AFCI momentary push button S2, then at step 192 the ACFI test subroutine is executed (FIG. 18d). Microcontroller U2's output pin 12 goes high at step 196, thereby (at 198) triggering the gate of thyristor Q2 (FIG. 9), thus allowing a current flow from hot to neutral through current-limiting resistor R25 and through spark gap GAP1. This causes the occurrence of real, sputtering arcing in the hot conductor of the electrical branch circuit under test. At the same time output pin 12 goes high, at step 200 microcontroller U2 starts an internal timer with a resolution of 0.1 ms. If at step 202 a predetermined e.g. time (such as 4 ms.) elapses (times out) from the time momentary push button S2 is activated, then at step 204 the test function will be terminated by switching output pin 12 low, turning off thyristor Q2 at step 206, and at step 210 LED D17b will be lit in red in order to indicate to the user that the AFCI unit being tested has failed to trip the circuit within the required time.

The device also has the capability to locate the particular circuit-interrupting device that protects the electrical branch circuit under test. In order to perform this task, it is necessary to transmit an identification signal over the power line system, performed at subroutine 240 in FIG. 18a and detailed in FIG. 18f. This signal can be detected and evaluated by the later-described signal detector.

Three subcircuits, comprised of (FIG. 9) thyristor Q3 and capacitor C7, thyristor Q4 and capacitor C8, and thyristor Q5 and capacitor C9, are employed in order to generate this identification signal. The reason why three similar subcircuits are used is that any one of those subcircuits will be activated in accordance with the previously analyzed wiring scenario. Thyristor Q3 and capacitor C7 work from hot with respect to ground. Thyristor Q4 and capacitor C8 work from hot with respect to neutral. Thyristor Q5 and capacitor C9 work from neutral with respect to ground. When a zero crossing of a hot conductor has been detected in the above-described manner (steps 250), microcontroller U2 starts an internal timer at 252 with a resolution of 0.1 ms in order to detect the phase angle of the power line sine wave. When the positive half-cycle of the sine wave reaches approximately 44 electrical degrees, then at step 258 any one of the microcontroller U2's output pins (16, 17 or 18) goes high, thereby (at 260) triggering the gate of any of the three thyristors (Q3, Q4, or Q5). When this happens, the associated capacitor (C7, C8, or C9) will be charged relatively instantly, thereby causing the occurrence of a strong electromagnetic field for a duration of approximately 0.63 ms. When at step 266 the phase angle reaches approximately 90 electrical degrees, at step 268 the microcontroller U2 switches the previously activated output pin low and, therefore, the energized thyristor goes out of conduction. The algorithm then loops. When a phase angle of approximately 224 electrical degrees has been reached, U2 again switches its output pin high in order to trigger the gate of the thyristor, thereby forcing the thyristor into conduction. Since 224 degrees is in the negative half-cycle of the sine wave, the capacitor now relatively instantly discharges, thereby causing another occurrence of a strong electromagnetic field for a duration of approximately 0.63 ms. At 270 electrical degrees, the microcontroller's output pin will be switched low again and, therefore, the thyristor goes out of conduction. The same sequence happens during the following sine wave cycle. However, after the fourth half-cycle (step 272) the counter is cleared and no such pulsing sequence occurs. This three-wave cycle is repeated continuously in order to generate an obviously distinct and artificial pattern which is readily recognized by the later-described detector.

Signal Detector

This unit has the following features:

1. It is a wireless AC voltage sensor.
2. It is an automatic circuit-interrupting device locator.
3. It features a "low battery" indicator.
4. It features an automatic shut-off function.
5. It features an automatic alert function.
6. It features automatic switchover between different functions.

Figure 13A:
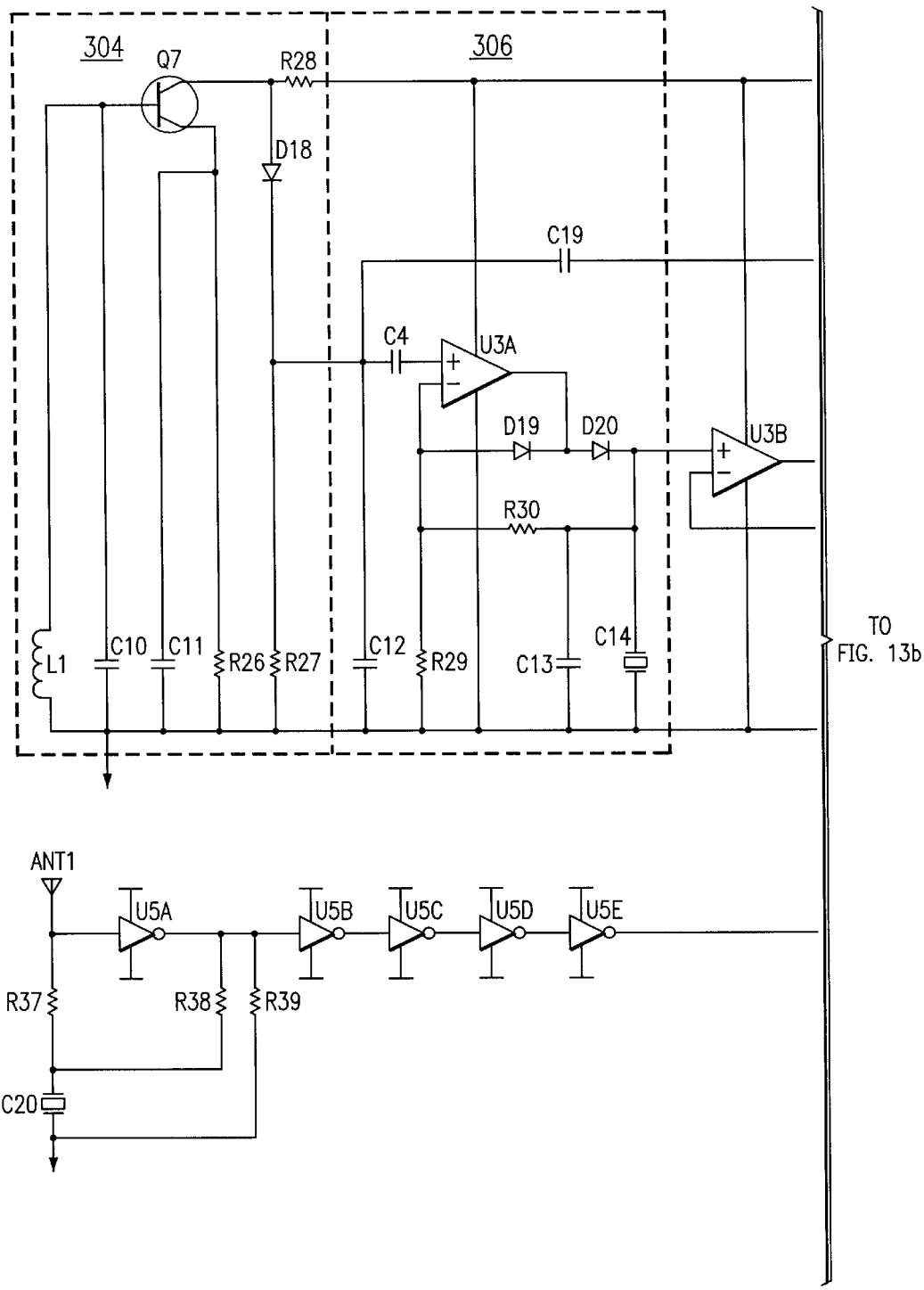
FIG. 13 is a schematic diagram of a preferred embodiment of a signal-detector in accordance with the present invention.
Figure 13B:
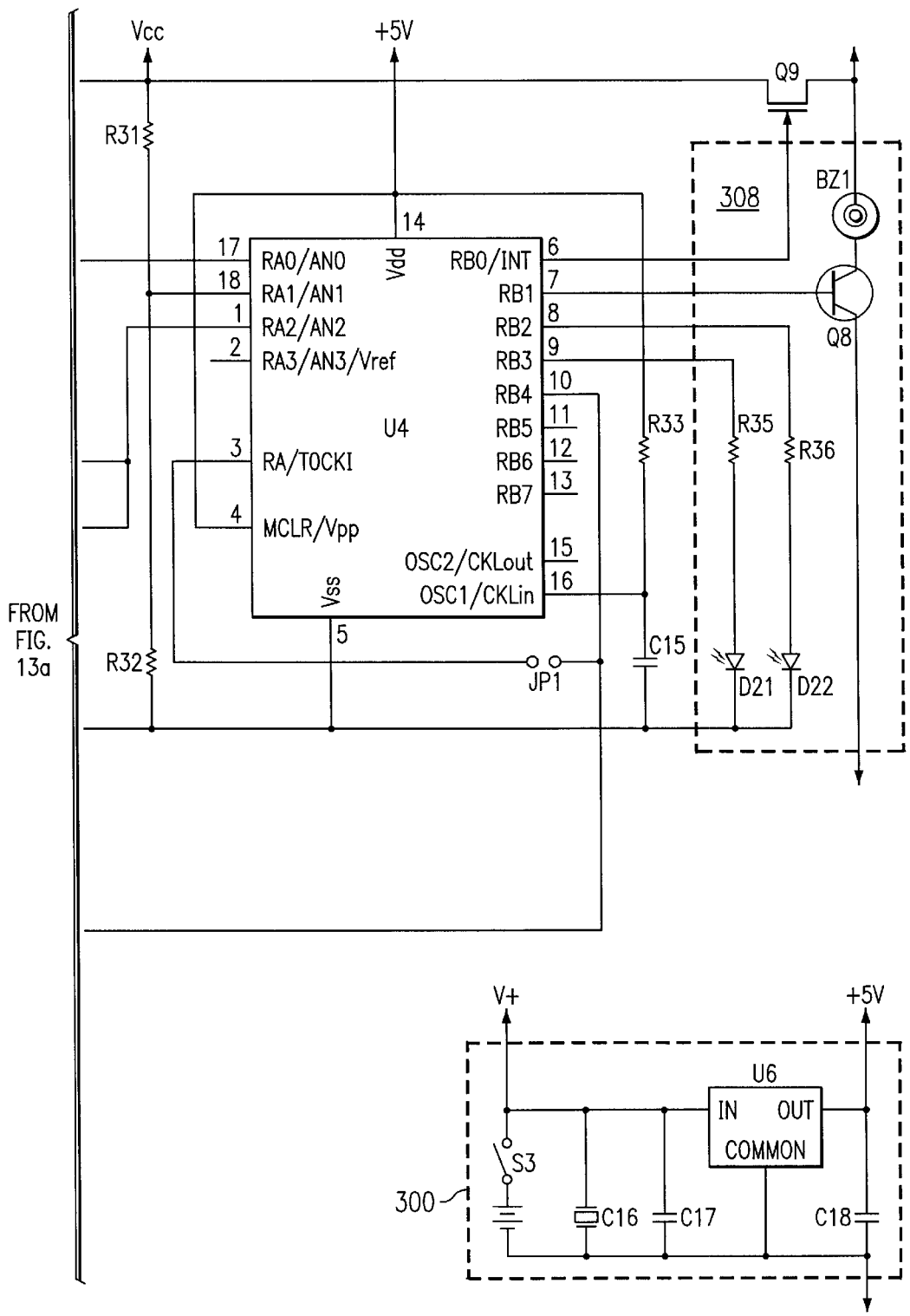

The unit is a battery-powered hand-held device. As it is apparent from FIG. 13, it can be divided into six different function blocks that are named as follows:

Power Supply 300.
Voltage Sensor 302.
RF Detector 304.
Peak Voltage Detector 306.
Microcontroller U4.
Audible and Visible Indicator 308.

The core component of the unit conveniently is a Microchip PIC 16C710 microcontroller U4 with the same features as the microcontroller utilized in the above-described signal generator, but with fewer I/O pins. Since the operating voltage of microcontroller U4 needs to be in the range between 4 and 6VDC, a positive 5V voltage regulator (U6) is employed. Electrolytic capacitor C8 and capacitor C9, connected to the input of U6, are used in order to filter any possible ripple out of the 9V battery voltage. Electrolytic capacitor C10 filters any possible ripple that might be present on the output of microcontroller U4. SPST switch S3 serves as a simple power-on/power off switch. Components S1, C8, C9, C10 and U2 form a battery power supply 300 for the unit.

A broadly tuned resonance tank, comprised of RF choke L1 and capacitor C10 in parallel, picks up the identification signal that is drawn over the power line system by the earlier-described signal generator. Transistor Q7 and its associated components—capacitor C11, resistor R26, resistor R27, resistor R28 and diode D18—act as a RF amplifier. The resonance tank and the amplifier together form an RF detector 304. The output of this detector is, in one way, coupled through capacitor C11 to the non-inverting input of operational amplifier U3A. In another way, it is also coupled through capacitor C19 to pin 17 of microcontroller U4. Operational amplifier U3A—in conjunction with resistor R29, resistor R30, diode D19, diode D20, capacitor C13 and electrolytic capacitor C14—form the above-mentioned peak voltage detector 306. The output signal of the peak voltage detector is a DC voltage equivalent to the peak voltage of the RF signal which has been picked up and amplified by the RF detector. This output signal is fed through operational amplifier U3B to analog input pin 1 of microcontroller U4. Op Amp U3B is configured as a unity-gain amplifier (voltage follower) in order to provide high impedance for microcontroller U4's analog input. A resistor network, comprised of resistor R31 and R32, acts as a balanced-voltage-divider and is connected across the battery voltage. Since it is a balanced voltage divider, the voltage present at the junction of this resistor network is exactly half the battery voltage. This voltage is fed to analog input pin 18 of microcontroller U4 in order to enable U4 to detect when this voltage falls below a predetermined value, which indicates a low battery voltage. An RC combination, comprising resistor R33 and capacitor C15, is connected to pin 16 of U4. This RC combination determines the clock speed for the microcontroller. A dual-color LED (D21 and D22) is connected through two current-limiting resistors (R35 and R36) to U4's output pins 8 and 9. Microcontroller U4's output pin 7 is connected to the base of transistor Q8. Transistor Q8 acts as an amplifier for piezo buzzer BZ1. LEDs D21 and D22, resistors R35 and R36, transistor Q8 and piezo BZ1 form the above-mentioned audible and visual indicator 308. Transistor Q9, whose base is connected to U4's output pin 6, acts as a semiconductor switch in order to disconnect the analog part of the circuit from the battery power if required.

A CMOS inverter (U5A), in conjunction with resistors R37 and R38 and tantalum capacitor C20, forms a low-frequency oscillator, which is triggered by varying an electromagnetic field received on antenna ANT1. Antenna ANT1 is simply a small piece of metal or a copper zone on a printed circuit board (PCB). This antenna picks up a 50/60 Hz electromagnetic field. U5A's output is an oscillating signal whose frequency is a function of the strength of the 50/60 Hz electromagnetic field sensed by antenna ANT1. Resistor R39, connected across U5A's output pin 2 and signal ground, determines the sensitivity of the low-frequency oscillator. The oscillating signal is fed through four additional CMOS inverters (U5B, U5C, U5D and U5E) to U4's input pin 10. The additional CMOS inverters are employed in order to amplify the oscillator's output. Antenna ANT1 is used to determine whether an adjacent circuit is energized with AC power, while tuned tank L1, C10, etc. is meant to receive the identifying signal generated by the signal generator (FIG. 9).

Figure 19A:
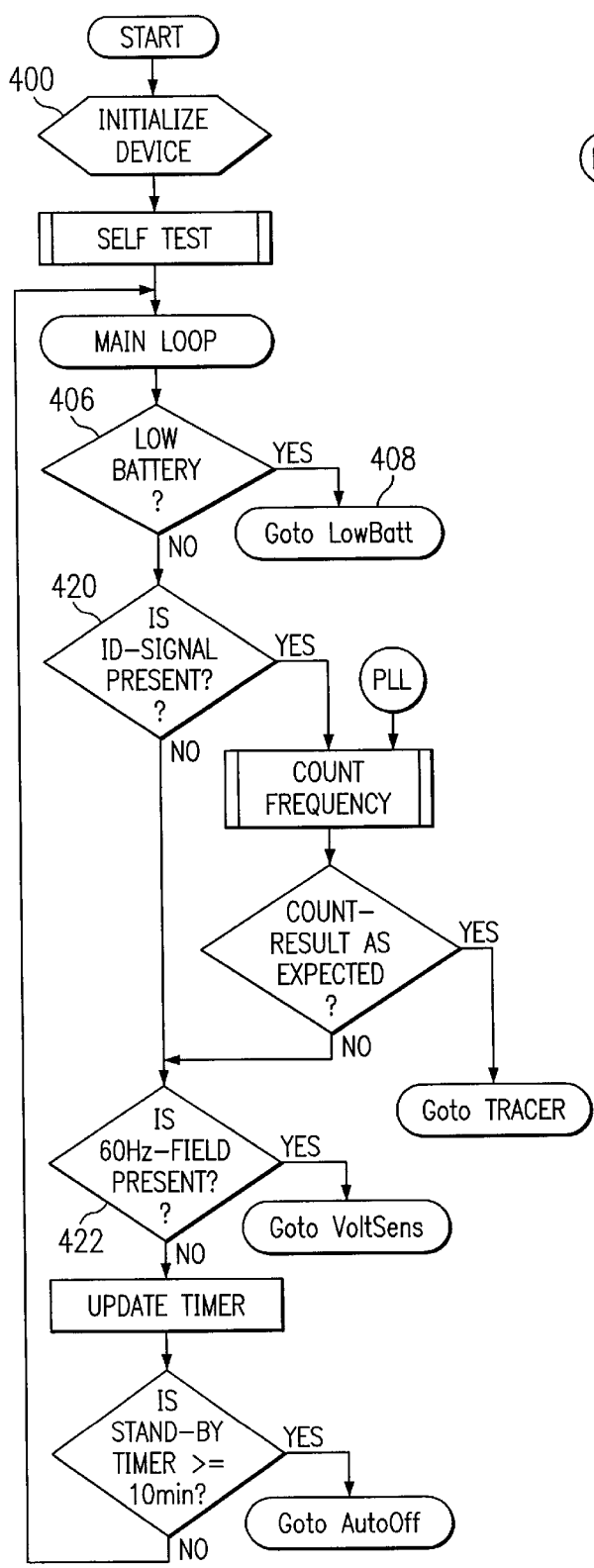
FIGS. 19a through 19c is a software flowchart of a signal detector in accordance with a first embodiment of the present invention.
Figure 19C:
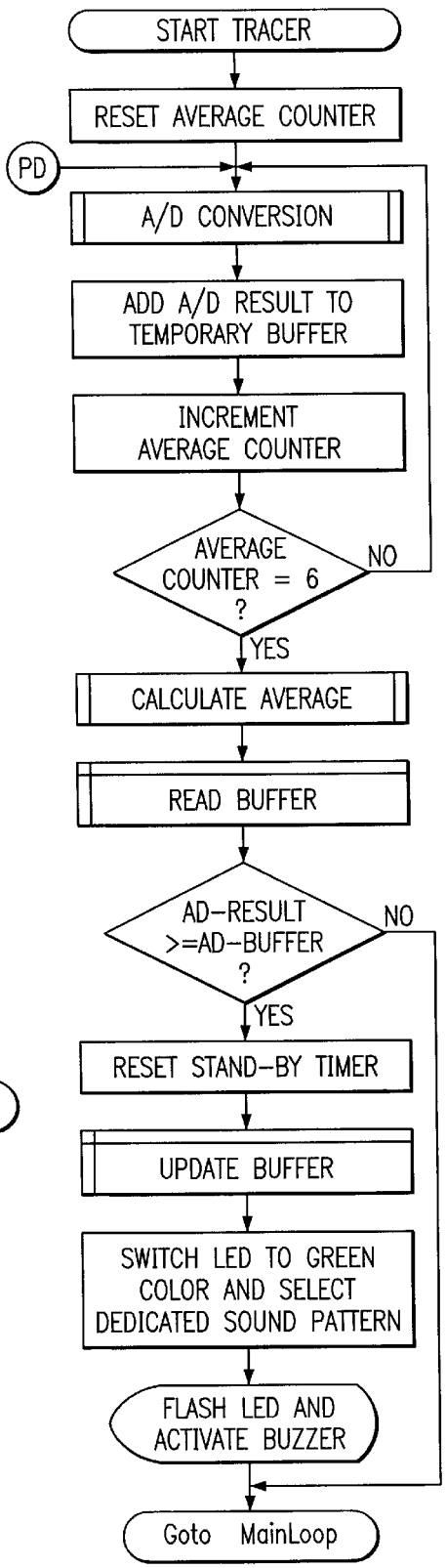
Figure 19B:
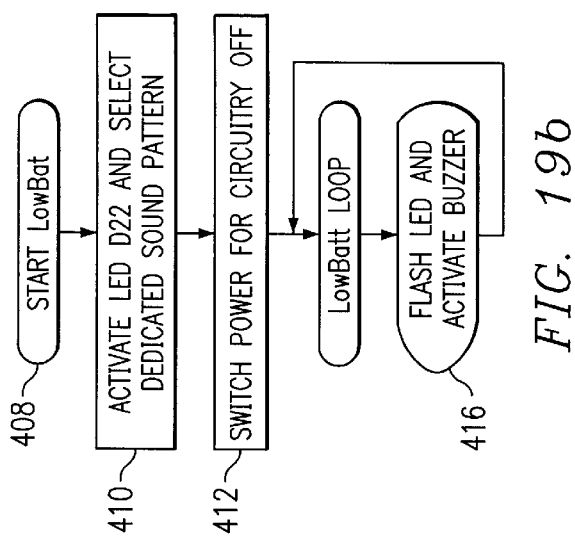

The flow diagram in FIGS. 19(a)–(c) provides a better understanding of how the receiver unit works.

When power gets applied to the unit through S3, microcontroller U4 immediately starts operating in the same manner as the microcontroller U2 in the above-described signal generator. After initialization at step 400, U4 at step 406 first measures the voltage present on its analog pin 18 in order to check if the battery voltage is sufficient. If the battery voltage is too low, then at 408 U4 activates its output pins 7 and 8 (see FIG. 19b) in a predetermined pattern at 410 for approximately 5 seconds. This results in an intermittent flashing of LED D22 (red) and an intermittent sounding of piezo BZ1; this is the alert for low-battery status. After those 5 seconds, at step 412 microcontroller U2 gets into a "sleep" mode, thereby drawing minimum current. If the user does not manually switch the unit off (S3), then U4 periodically—approximately every five minutes-activates LED D22 (red) and piezo BZ1 in a distinct predetermined pattern lasting approximately 5 seconds at step 416. This is meant to be an alerting signal to the user in the event that the unit has been misplaced or forgotten.

Returning to FIG. 19a, if the battery voltage is sufficient, microcontroller U4 switches its output pin 6 high, thereby turning on transistor Q9. This permits the battery voltage to be applied to the rest of the circuit. Microcontroller U4 next switches its output pin 9 high, thereby lighting LED D21 (green) to indicate that the unit is in standby mode. Then, at step 420 microcontroller U4 checks for the presence of a signal at its input pin 10 in order (at 422) to detect if a 50/60 Hz electromagnetic field of a predetermined strength is present. If such a field is present, then the unit goes into AC voltage sensor mode, which is indicated by turning off green LED D21 and turning on red LED D22. U4 then generates a distinct sound and light pattern for LED D22 and piezo trigger BZ1. The duty cycle of this pattern increases or decreases with respect to the strength of the detected electromagnetic field. The perceived effect of this indication sequence is similar to that of a Geiger counter. One technical advantage of this indication methodology, in addition to the flexibility of being able to sense electromagnetic fields of varying strengths, is that the user accomplishes it without the need for continuous, or any, manual adjustment. If, however, such an electromagnetic field is not present or detectable within a timeframe of approximately one second, then the unit remains or returns to standby mode. When the unit is in voltage sensor mode, it also checks for the presence of a signal on its input pin 17. If there is a signal on this input pin, then U4 measures the duration and rate of repetition of the signal. If those two parameters match the pattern of the identification signal generated by the signal generator, then the unit switches into breaker-locator mode. An LED will light in yellow to indicate this. Processor U4 then measures the voltage present on its analog input pin 1. If the voltage on pin 1 is equal to or greater than a predetermined threshold value, then this threshold value will be overwritten with the value currently present on pin 1 and a visible and audible alerting signal will be generated (D21, D22 and BZ1). Once a complete scan of the circuit-interrupting devices in question is done, as by moving the receiver to be proximate to each candidate circuit interrupting device, the highest detected voltage level becomes the current threshold value. During a second—or any subsequent—scan, this threshold value will be equal to the picked-up value of the identification signal only when the detector is adjacent to the particular circuit-interrupting device which had the strongest identification signal during the first scan. This identifies the circuit-interrupting device for the branch to which the transmitter is connected. If an identification signal cannot be detected anymore for a period of time of approximately four seconds, then the unit automatically switches back to voltage-sensor mode.

If the unit is in standby mode for approximately five minutes, then U4 switches its output pin 6 low, which switches transistor Q9 off, thereby disconnecting the power for the entire circuitry, except the microcontroller itself. Microcontroller U4 gets into "sleep" mode and the same process as mentioned above takes place.

Figure 20:
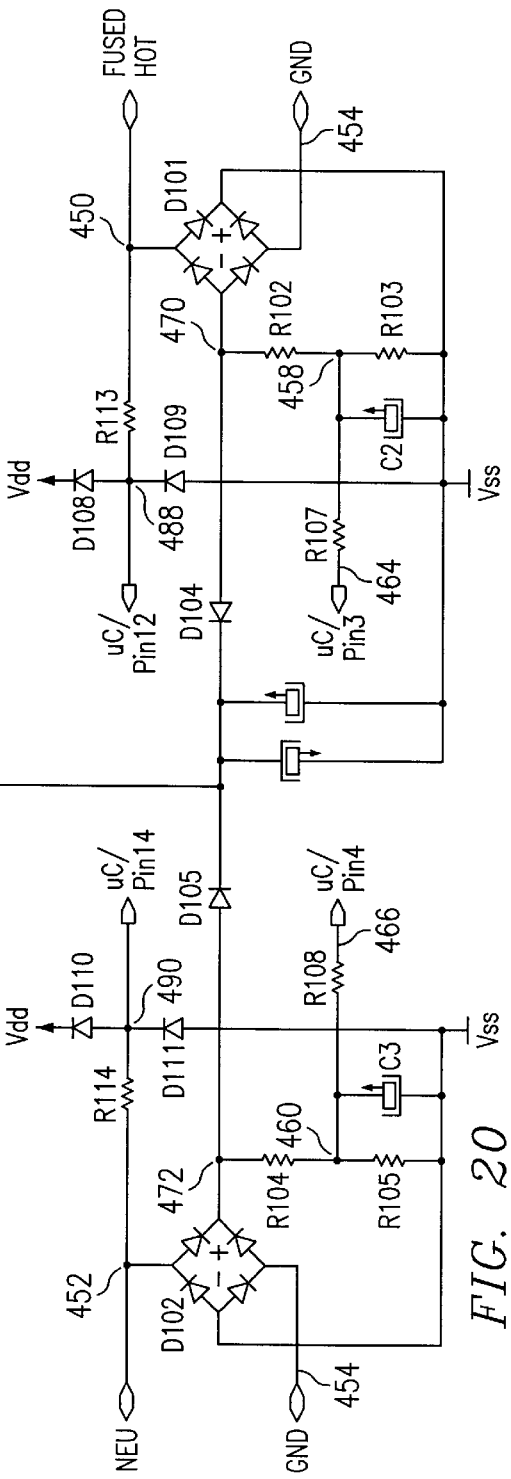
FIG. 20 is a detailed schematic electrical diagram of a power supply according to a further embodiment of the invention.
Figure 21A:
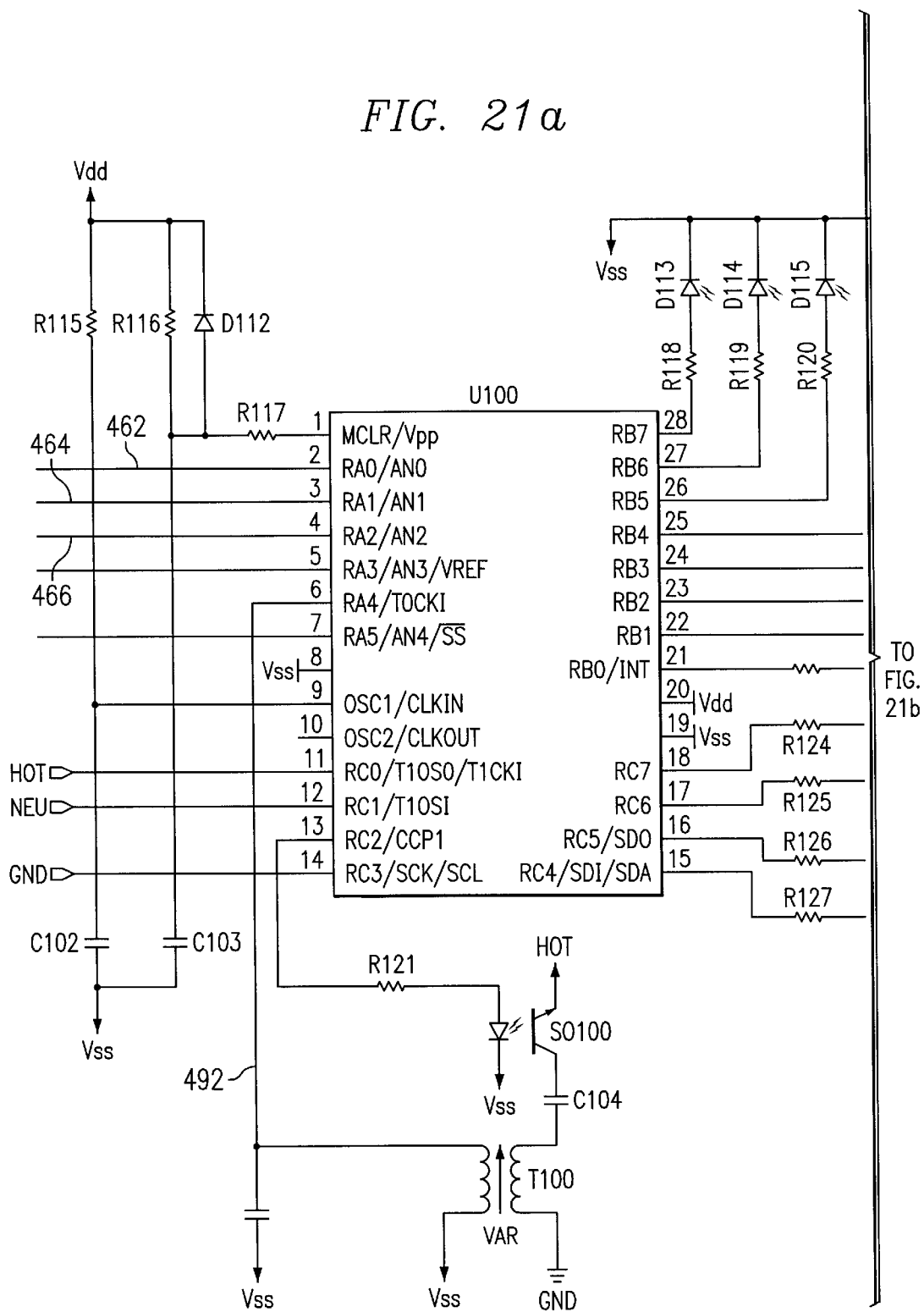
FIG. 21 is a detailed electrical schematic diagram of a signal generator according to a second preferred embodiment of the present invention.
Figure 21B:
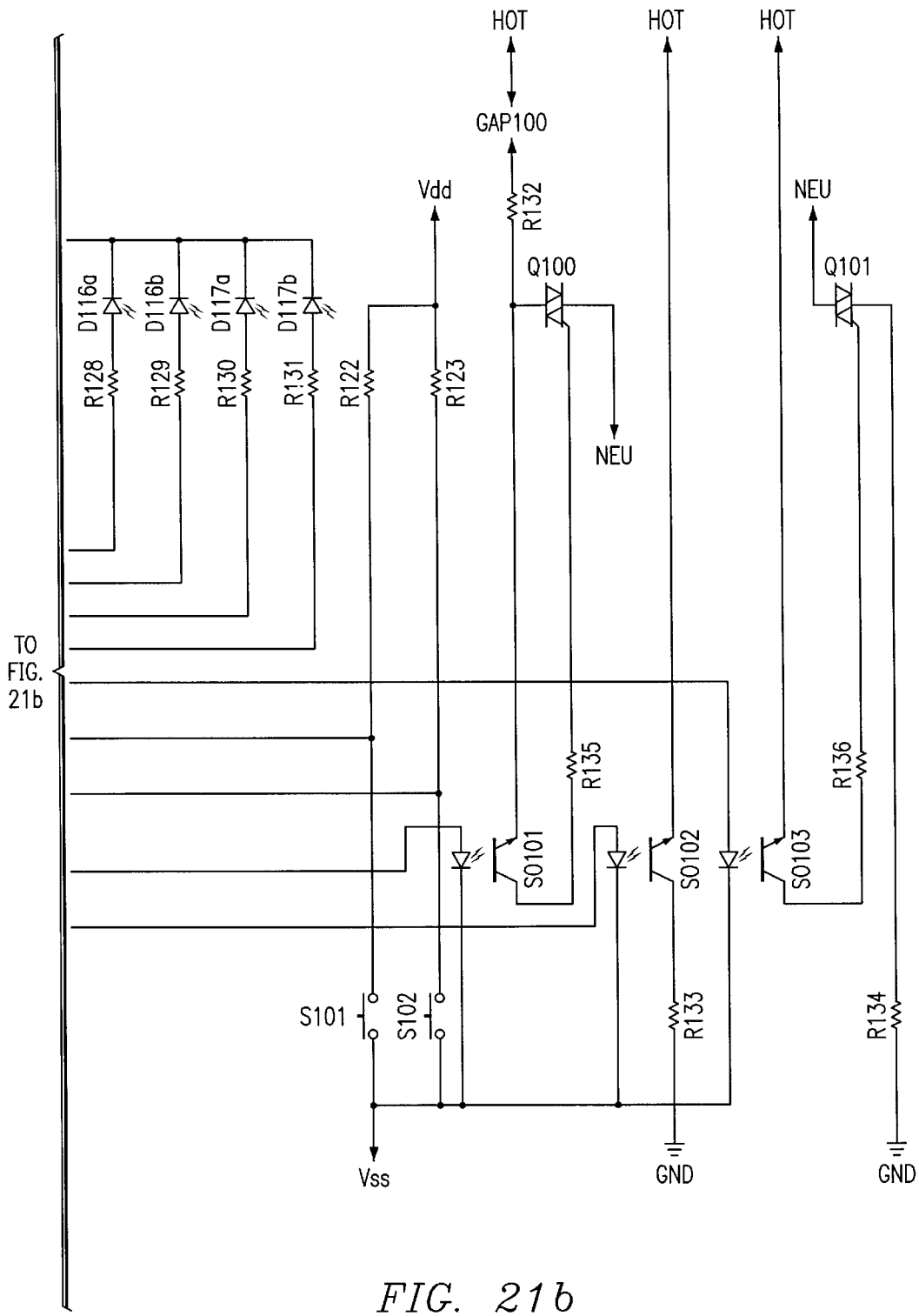

FIGS. 20–31 illustrate a further and even more particularly preferred embodiment of the invention. In this embodiment, the core component of the signal generator continues to be a microcontroller U100 (FIG. 21) which provides a variety of digital and analogue input and output ports. FIG. 20 displays the schematic of a preferred transformerless power supply for the unit. Three full-wave bridge rectifiers D100, D101, and D102 are connected across the HOT and NEU conductors (nodes 450 and 452), the HOT, and GROUND conductors (nodes 450 and 454) and the NEU and GND conductors (nodes 452 and 454). The employment of three separate bridge rectifiers is necessary because the unit needs to be powered under different possibly present wiring scenarios. Three voltage dividers, each of them comprised by a pair of resistors (R100 and R101 for D100, R102 and R103 for D101, and R104 and R105 for D102) provide, at their respective center junctions 456, 458, 460, DC voltages which are fed through three current limiting resistors (R106, R107, and R108) to the input pins or nodes 462, 464, 466 of a digital to analogue converter which is incorporated into microcontroller U100 (FIG. 21). The DC voltages present at the center junctions of those voltage dividers vary in accordance with the wiring scenario present at the power line outlet (receptacle) under test. Table II shows the different DC voltage values at multiple wiring scenarios.

TABLE II

|  | H-N | H-G | N-G |
|---|---|---|---|
| Correct wiring with proper Earth-Ground Integrity | 2.09 VDC | 2.05 VDC | 1.04 VDC |
| Correct wiring with compromised Earth-Ground | 2.09 VDC | 2.05 VDC | 1.04 VDC |
| Open Earth-Ground | 2.09 VDC | 1.04 VDC | 1.04 VDC |
| Open Neutral | 1.08 VDC | 2.07 VDC | 1.05 VDC |
| Reversed Hot and Neutral | 2.12 VDC | 1.05 VDC | 2.05 VDC |
| Reversed Hot and Earth-Ground | 1.07 VDC | 2.08 VDC | 2.08 VDC |
| Hot on Neutral with open Neutral and proper Earth-Ground | 1.18 VDC | 1.05 VDC | 2.07 VDC |
| Hot on Neutral with open Neutral and compromised Earth-Ground | 1.18 VDC | 1.05 VDC | 2.07 VDC |
| Two hot wires on the Hot and Neutral terminals | 4.25 VDC | 3.11 VDC | 3.10 VDC |
| Two hot wires on the Hot and Earth-Ground terminals | 3.17 VDC | 4.16 VDC | 3.12 VDC |
| Unenergized circuit | 0.00 VDC | 0.00 VDC | 0.00 VDC |

The positive outputs 468, 470, 472 of the bridge rectifiers D100, D101, D102 are connected together, through three isolating diodes D103, D104, and D105. The three isolating diodes D103–D105 are necessary in order to avoid a DC voltage feedback from any of the three sub circuits to another. Regardless of what wiring scenario is present, a DC voltage is always provided at the common junction 474 of those diodes which is further processed to power the entire circuitry. The only exception is if the outlet or line under test is not energized at all.

Figures 22, 23:
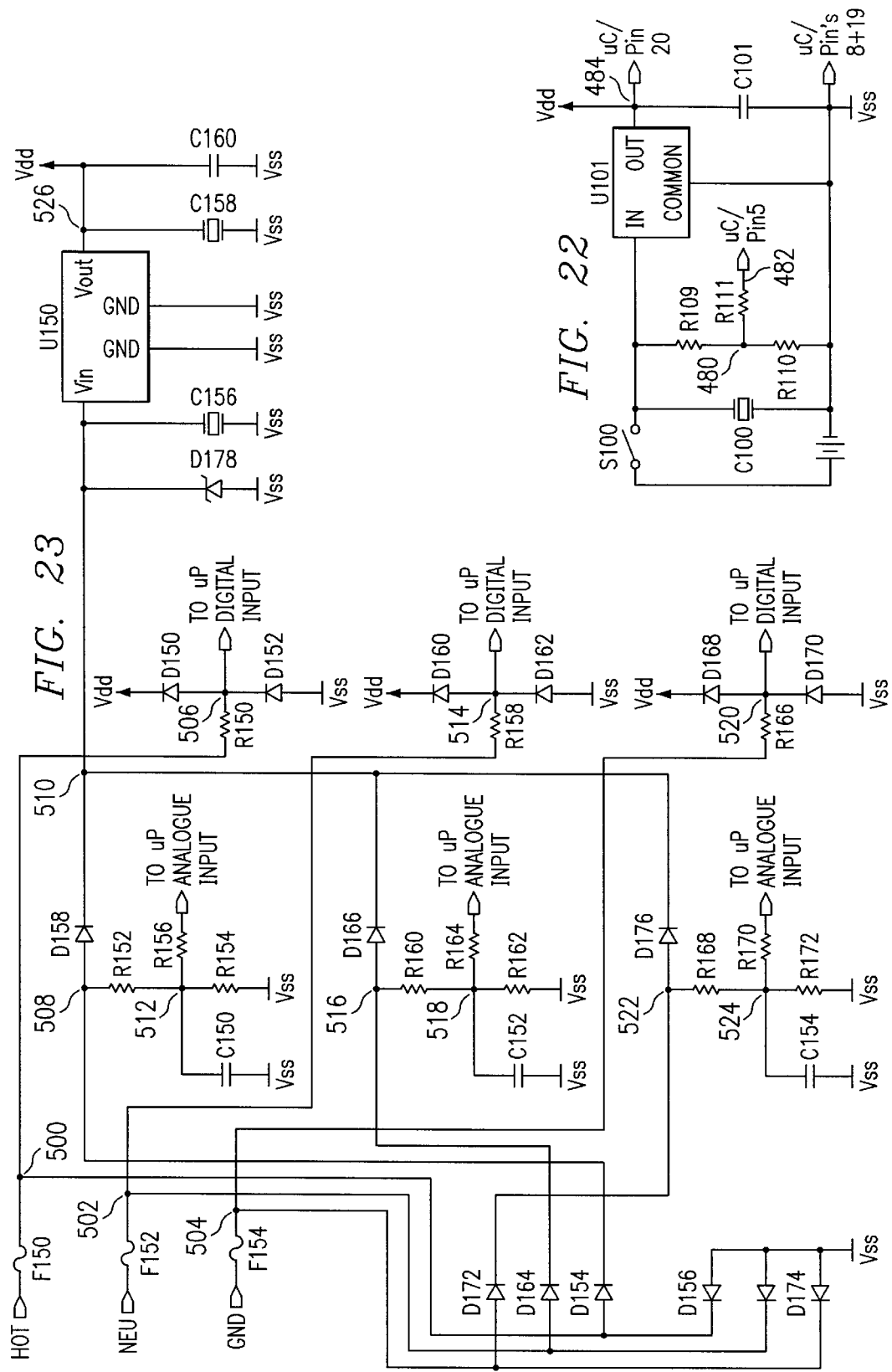
FIG. 22 is a schematic electrical diagram of a battery driven power supply component of a signal generator according to the invention.
FIG. 23 is a schematic electrical diagram of a further power supply according to the invention.

The unit is alternatively powered by a 9V battery as mentioned above in order to insure that the unit can indicate an unenergized electrical branch circuit. FIG. 22 displays the schematic of such a battery power supply. This power supply is optional and could be omitted to save space and cost. The battery BT1 is automatically switched on through optoisolator/voltage regulator U101 if the unit is connected to an energized electrical branch circuit. Single pole, single throw (SPST) switch S100 is employed in order to power the unit alternatively if the electrical branch unit under test is absolutely unenergized as when the unit is not connected to an electrical branch circuit at all. Electrolytic capacitor C100 is employed in order to filter any low frequency ripple out of the battery supply voltage. Another voltage divider comprised by resistors R109 and R110 provides at its center junction 480 a DC voltage with a maximum value of +5V. This voltage is fed through current limiting resistor R111 to an analogue input pin 482 of microcontroller U100 (FIG. 21). If the supply battery voltage falls below a predetermined voltage (5.5V) the controller U100 indicates the fact that the battery is low and switches after a time period of approximately 30 seconds the entire unit off because a reliable operation is not guaranteed in such a case. Returning to FIG. 20, voltage regulator U101 provides at its output pin 484 a stable DC voltage of 5.1V which is the required operating voltage for microcontroller U100. Capacitor C101 filters any high frequency ripple out of the supply voltage.

All three power line conductors (HOT, NEU, and GND) are connected through current limiting resistors R112, R113, and R114 to digital input pins 486, 488, 490 of microcontroller U100 (FIG. 21). Three pairs of diodes (D106–D107, D108–D109, and D110–D111) limit the power line AC voltage to a maximum voltage of 5.1V+/−0.7V (the breakover voltage of the diodes). This arrangement assures that microcontroller U100 can detect when zero crossing of the power line sine wave occurs at either one or several of the three power line conductors.

Referring to FIG. 21, an RC network comprised of resistor R115 and capacitor C102 in series determines the clock frequency for microcontroller U100 (preferably 4.0 MHz). Another network comprised of resistors R116 and R117, capacitor C103 and diode D112, forms a subcircuit which assures that microcontroller U100 is provided with power on reset (POR).

The preferred embodiment of the transmitter unit includes three light emitting diodes (D113, D114, and D115) of different colors (green, yellow, and red) which are lit in certain patterns by microcontroller U100 in order to indicate the present wiring scenario or condition attached to the unit in accordance with Table 1. Resistors R118, R119, and R120 are respectively connected in series with LEDs D113, D114, and D115 to limit the current for those three LEDs.

The indication of a given wiring condition preferably also includes an indication of either a proper or a compromised earth ground connection of the electrical branch circuit under test. The analysis of earth ground integrity preferably works in the following way. The software for microcontroller U100 provides a pulse-width modulated (PWM) signal of a frequency of approximately 450 kHz. This signal is fed through current limiting resistor R121 to the anode of an LED which is incorporated into an optoisolator SO100. Optoisolator SO100 provides a thyristor output having a terminal is connected to the HOT terminal of the power outlet being tested. The other terminal of the current path of this thyristor is connected through a coupling capacitor C104 to one terminal of a primary winding of a transformer T100. The other terminal of the primary winding is directly connected to earth ground. Since the output thyristor of optoisolator SO100 is controlled by its internal LED, which in turn is controlled by the above mentioned PWM signal, it follows the pattern of that PWM signal.

Capacitor C104, the primary winding of transformer T100 and the impedance of the earth ground, considered as a lossy conductor, form a phase shifting network. If parasitic impedance, which may have both real (resistance) and imaginary (reactance) components, and which can be caused by e.g. corroded or loose connections, is present at the earth ground connection, it adds on to the phase shifting network, thereby increasing the frequency which is seen at the primary winding of transformer T100. Transformer T100 is a step-up transformer, which means that its secondary winding provides an output voltage which is higher than the voltage on the primary winding yet has the same frequency as the voltage on the primary winding. The signal present on the secondary winding of transformer T100 is connected to a digital input pin 492 of microcontroller U100.

Microcontroller U100's software counts the frequency and compares it to the frequency of the PWM signal. By analyzing the difference of those two frequencies, it can determine the value the impedance of the earth ground conductor. This in turn provides the capability to decide, by comparing the detected value to a predetermined stored value, whether the earth ground impedance exceeds permissible levels.

Push buttons S101 and S102 are connected through current limiting resistors R124 and R125 to digital input pins 18 and 17 of microcontroller U100. Pull up resistors R122 and R123 hold those two digital input pins at a logical high level. If either of the two push buttons S101, S102 gets activated, the level at that digital input pin which is associated with the activated push button gets pulled to a logical low level. This in turn activates a software routine, which triggers a test function for a possible associated ground fault circuit interrupter circuit (GFCI) or arc fault circuit interrupter circuit (AFCI). If push button S101 gets activated, microcontroller U100's output pin 15 lights, through current limiting resistor R127, the LED which is enclosed in optoisolator SO102 thereby forcing the thyristor output of optoisolator SO102 into conduction. This causes the flow of a leakage current from the HOT conductor to the GND conductor through resistor R133. The value of resistor R133 determines the amount of leakage current.

LED D116 is a dual color (green and red) LED with a common cathode. If the wiring scenario or condition present at the electrical outlet under test is correct, then microcontroller U100's output pin 25 goes high and lights the green part of LED D116a through current limiting resistor R128, thereby indicating that the GFCI test function is available. If the present wiring condition is incorrect, the LED D116a remains in an off state meaning the GFCI test function is not available. If the GFCI test function is available and gets requested by having push button S101 activated then optoisolator SO102 gets activated for a predetermined period of time. During this period of time microcontroller U100's output pins 24 and 25 both go high, thereby lighting both parts of LED D116a, D116b, which results in D116 emitting a yellow color that indicates that the GFCI test function is activated. If the predetermined time elapses and the GFCI under tests does not trip, microcontroller U100's output pin 25 goes low while output pin 24 remains high for a predetermined period of time, and causing only red LED D16 to light up, thereby indicating that the test has failed.

Push button S102, in conjunction with microcontroller U100, current limiting resistors R130 and R131 and LED D117 operates in the same manner as described above to show and indicate a test function for an AFCI device. If this test function is requested by having push button S102 activated, optoisolator SO101 goes into conduction, which in turn forces alternistor Q100 into conduction. When alternistor Q100 is in a conductive state then spark gap GAP100 conducts as well, thereby causing current flow through load resistor R132 from the HOT conductor to the NEU conductor. The value of load resistor R132 determines the amount of current flowing. While this current is flowing a real sputtering arc is present at the electrical branch circuit under test. If the AFCI being tested does not trip within a predetermined period of time, the unit indicates that the AFCI has failed the test in the same manner as described for the GFCI test.

Depending on the present wiring condition at the electrical branch circuit under test, one or several of microcontroller U100's digital input pins 11, 12, or 14 will see a logical high as long as the positive half cycle of the power line sine wave lasts. Microcontroller U100 constantly monitors those three pins and as soon as it detects a zero crossing of the sine wave it starts counting the time in increments of microseconds. This allows calculating the current phase angle of the power line sine wave. When the phase angle reaches approximately 92 electrical degrees then microcontroller U100 activates one of optoisolators SO101, SO102, or SO103 depending on the wiring condition present. Activation of optoisolator SO101 causes triac Q100 to sink current from HOT, across GAP100, through resistor R132 and to NEU. Activation of optoisolator SO102 sinks current from HOT, directly from the emitter to the collector of the bipolar transistor incorporated therein, and thence through resistor R133 to GND. Activation of optoisolator SO103 in turn switches on triac Q101, which will then gate current from NEU, through resistor R134, to GND. The gating current to triacs Q100 and Q101 are respectively regulated by current-limiting resistors R135 and R136. This in turn causes the current of significant magnitude and short duration (approximately 2 microseconds) to flow from HOT to NEU, from HOT to GND, or from NEU to GND depending on which one of the mentioned triacs or transistors is currently active. This procedure repeats for three positive half cycles of the power line sine wave and then pauses for another 2 positive half cycles. This pattern gets repeated continuously as long as the electrical branch unit in test is energized. As a result of this activity a unique identification signal is present at the electrical branch circuit being tested and at its associated circuit interrupting device (e.g. circuit breaker or fuse).

FIG. 23 is an alternative embodiment of a transformerless power supply useful with the present invention. HOT, NEU and GND terminals are respectively connected through fuses F150, F152 and F154 to nodes 500, 502 and 504. Each of these nodes is in turn coupled to both digital and analog inputs of the microcontroller U100 (see FIG. 21) through a combination of current limiting resistors and diodes, as affected by respective voltage divider circuits.

Node 500 is connected through a current limiting resistor R150 to a node 506. An anode of a diode D150 is connected to node 506, which is also connected to a cathode of a diode D152. The anode of diode D152 is connected to signal ground $V_{ss}$ which the cathode of diode D150 is connected to positive DC voltage $V_{dd}$. Node 506 is connected to a digital input pin of microcontroller U100 (FIG. 21). Node 500 is also connected to the anode of a diode D154 and the cathode of a diode D156. The anode of diode D156 is connected to signal ground $V_{ss}$. The cathode of diode D154 is connected to a node 508. The anode of a diode D158 is connected to the node 508, while its cathode is connected to a common node 510 which in turn serves as the input to a voltage regulator or power supply integrated circuit U150. Node 508 is connected through a resistor R152 to a node 512, which is connected to signal ground by a capacitor C150 and a further resistor R154. A resistor R156 connects node 512 to an analog input of the microcontroller U100 (FIG. 21).

The connections of the NEUTRAL and GROUND terminals to the power supply are analogous. Node 502 is connected through a resistor R158 to a microcontroller digital input node 514. The node 514 is clamped between diodes D160 and D162, similar to the clamping diodes D150 and D152 of node 506. Node 502 is also fed to the anode of a diode D164, the cathode of which is connected to a node 516. Node 516 is connected to the anode of a diode D166 which is connected in turn to common power input node 510. Node 516 is further connected through a resistor R160 to a node 518. Node 518 is connected to signal ground by a capacitor C152 and a resistor R162. A current limiting resistor R164 connects node 518 to an analog input of the microcontroller U100.

Node 504 is connected through a current limiting R166 to a node 520, which is clamped between diodes D168 and D170 that are respectively connected to the positive DC voltage $V_{dd}$ and the signal ground $V_{ss}$. Node 520 is connected to a digital input pin of the microcontroller U100. Node 504 is further connected to the anode of a diode D172 and the cathode of a diode D174. The anode of diode D174 is connected to signal ground. The cathode of diode D172 is connected to a node 522, which in turn is connected through a resistor R168 to a supply node 524. Node 524 is connected through a current limiting resistor R170 to an analog input of the microcontroller U100. The node 524 is also connected by a capacitor C154 and a resistor R172 to signal ground. Node 552 is connected to the anode of a diode D176, the cathode of which is connected to the common node 510.

Node 510 is further connected to the cathode of a Zener diode D178 and to a capacitor C156. The anode of the Zener diode 178 and the capacitor C156 are both connected to signal ground. The power supply integrated circuit U150 has an output node 526 that provides positive DC voltage to the rest of the transmitter circuit. Filtering capacitors C158 and C160 connect the output node to signal ground.

The power supply circuit in FIG. 23 will supply positive DC voltage to the rest of the circuit as long as one of the hot, neutral and ground conductors is energized and another one provides a return path. The analog and digital inputs provided by the power supply permit the microcontroller to sense any of twelve different wiring conditions present at the outlet, as above described.

All of the above described functions are available for both commonly known power line systems which are 60 Hz/120 V for North America and Asia and 50 Hz/220V for Europe, Australia and Africa. The unit adjusts itself automatically to the power line system where it gets connected.

Figure 24A:
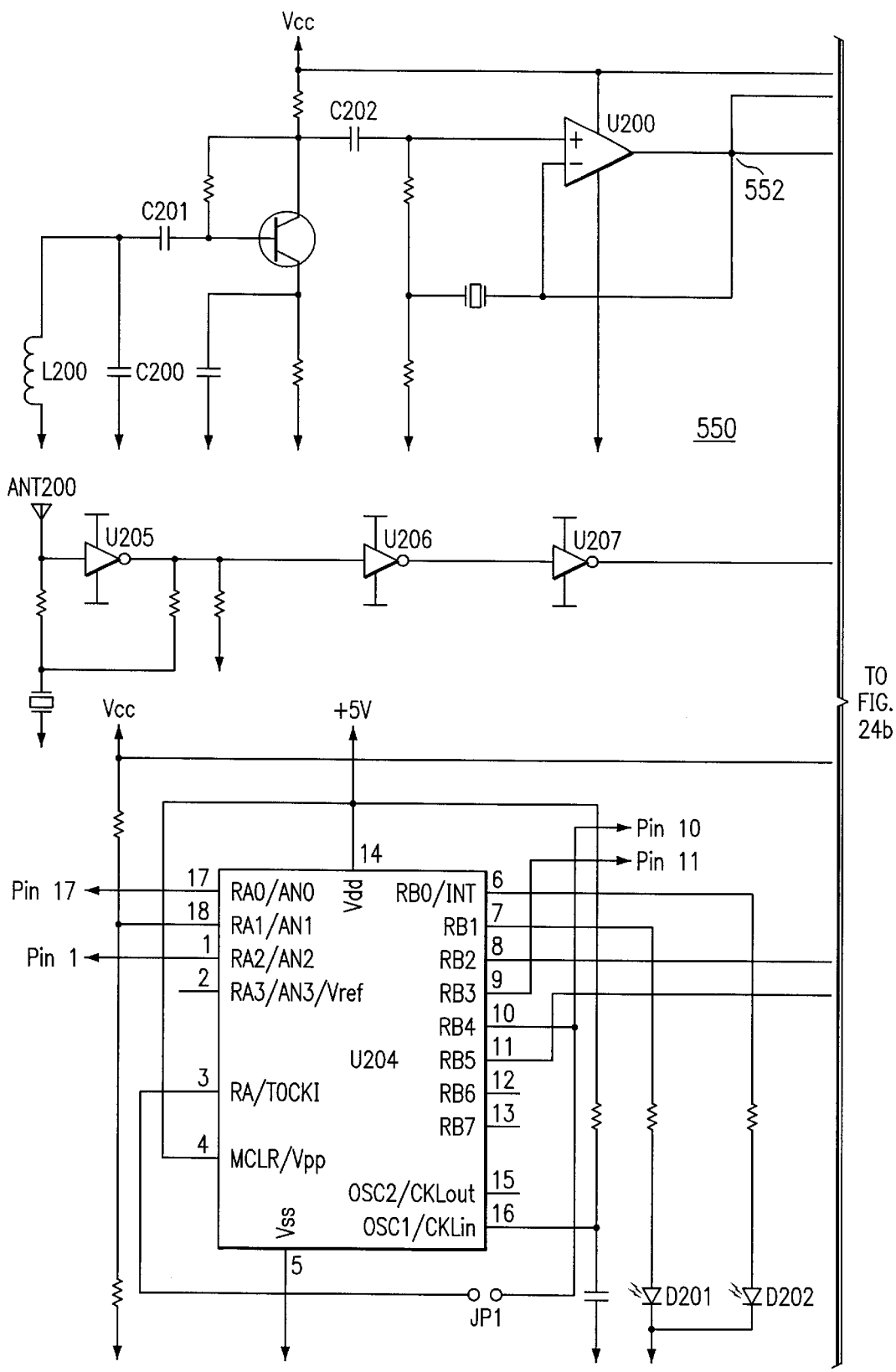
FIG. 24 is a schematic electrical diagram of a signal detector according to a second preferred embodiment of the invention.
Figure 24B:
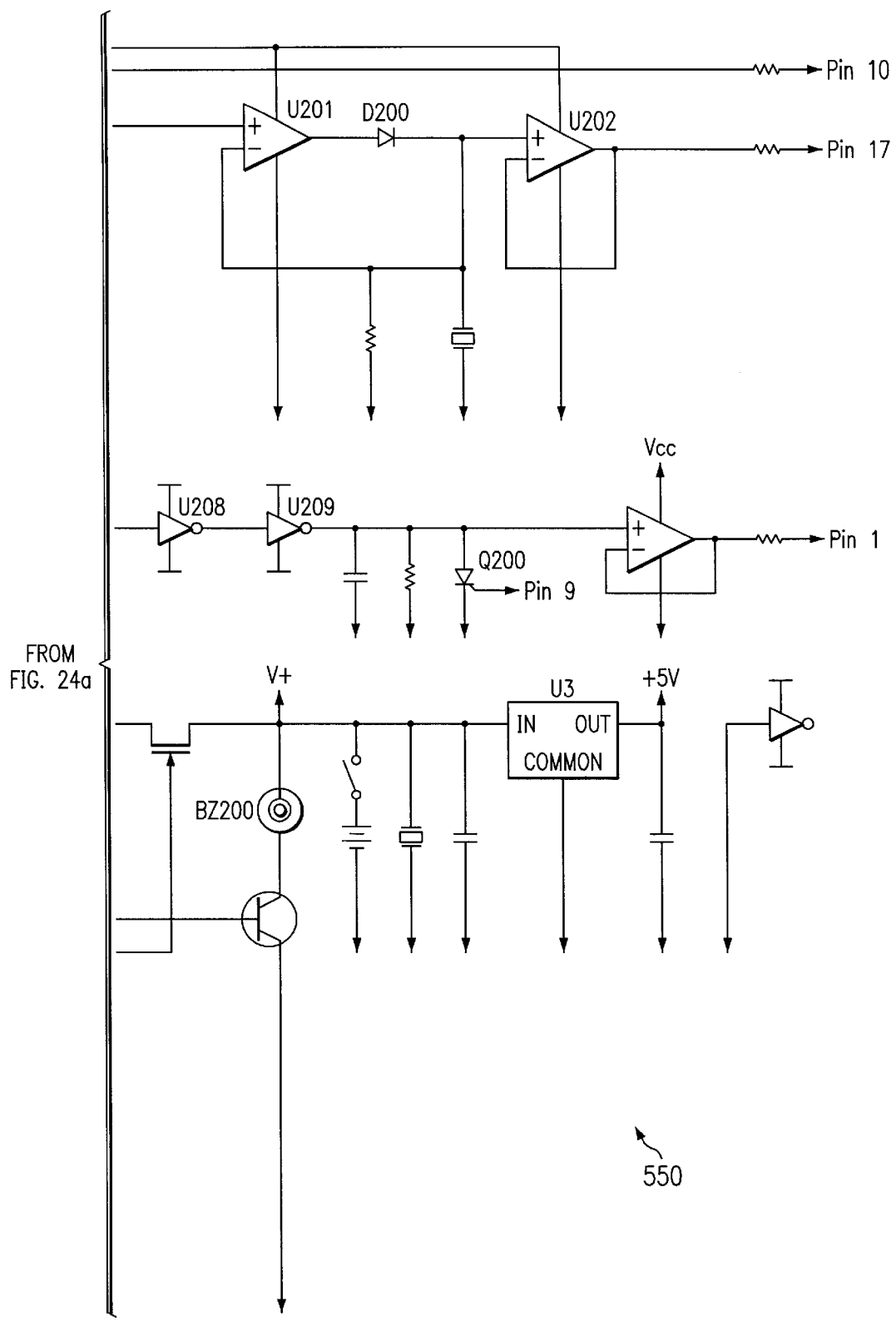

An alternative and particularly preferred embodiment of a signal detector 550 according to the invention is shown in FIG. 24. Unit 550 is a microprocessor controlled, battery powered hand held apparatus. Pick up coil L200 in conjunction with capacitor C200 forms a tank whose resonance frequency is broadly tuned to the frequency of the identification signal which is generated by the above described generator (see FIGS. 20–23). The sensed frequency is AC coupled through capacitor C202 to the inverting input of operational amplifier U200 that is configured as a noninverting preamplifier with a gain of 100. Operational amplifier U201 is another noninverting amplifier which further amplifies the signal which is available at the output 552 of op amp U200 with a gain of 20. The signal available at the output of op amp U201 is fed through a diode D200 to the inverting input of operational amplifier U202 that is configured as a unity gain voltage follower. The output of op amp U202 is connected to a capture and compare input pin of microcontroller U204. The software associated with microcontroller U204 compares the appearance pattern of the signal with the expected pattern as it was generated in the manner described above by the signal generator. If the two patterns match it is assumed that the detected signal is truly the identification signal generated by the signal generator. If this is the case microcontroller U204 activates LED D201 and buzzer BZ200. The visual and audible alert is meant to indicate that the circuit interrupting device in question has been located. If the two patterns do not match it is assumed that the detected signal is not the identification signal generated by the signal generator but rather some kind of electrical power line noise. If this is the case the signal will be ignored.

Inverter U205 is configured as a low frequency square wave generator. Antenna ANT200 is a simple metal pad with a resonance band in the range of approximately 45 to 65 Hz. If the unit approaches an electrical power line circuit the antenna senses the magnetic field generated by the power line sine wave. This causes a frequency shift of the square wave generated by oscillator U205. The frequency shift increases equivalently to the strengths of the sense magnetic field. The inverters U206, U207, U208, and U209 are simple frequency amplifiers. The output signal of inverter U209 is connected through triac Q200 to a digital input pin of microcontroller U204 that is configured as a frequency counter. If a magnetic power line field has been detected, microcontroller U204 again activates LED D201 and buzzer BZ200 yet with a different pitch in order to distinguish the two different signals from each other. The duty cycle of the controller frequency changes in accordance to the strengths of the detected magnetic field, which means that the control frequency for LED D201 and buzzer BZ200 increases as stronger as the sensed magnetic field appears.

Figure 25:
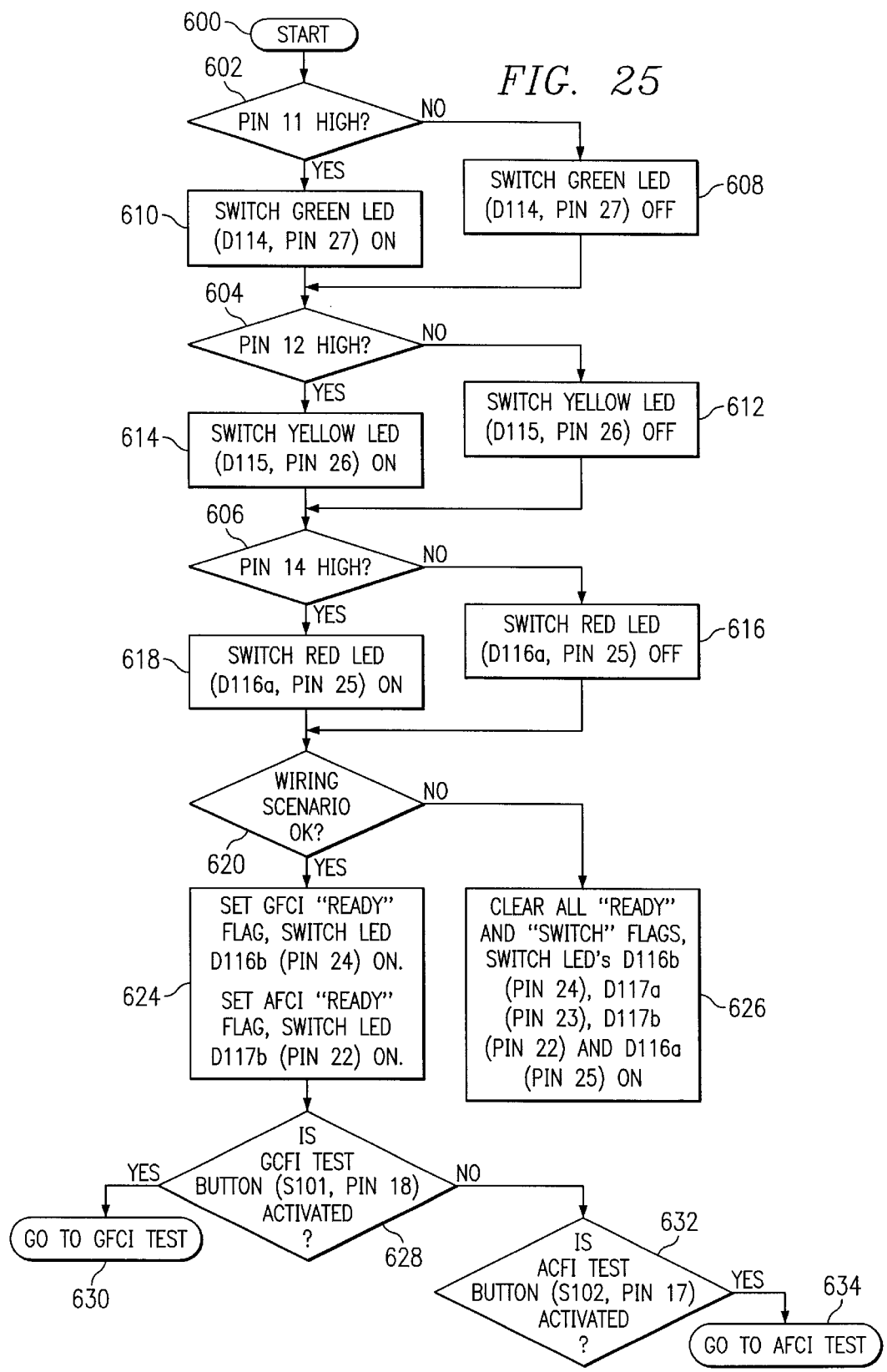
FIG. 25 is a software flow diagram of an algorithm used by the microcontroller in the signal generator shown in FIG. 21.

FIG. 25 is a flow chart showing the operation of microcontroller U100 in FIG. 21. From a start condition 600 the program will query whether pin 11 (hot), pin 12 (NEU) and pin 14 (GND) are high at decision steps 602, 604 and 606. Depending on the voltage states which are sensed, LEDs D114, D115 and D116a will be switched on or off at steps 608–618.

At decision step 620 the program analyzed whether the wiring scenario or condition is as it should be, i.e., with pin 11 high and pins 12 and 14 low. If this is the case, the program branches to step 624, at which the GFSI "ready" flag is set, the AFCI "ready" flag is set, and LEDs D116b and D117b are switched on. If, on the other hand, the program determines that the wiring condition is incorrect, all "ready" and "switch" flags are cleared at step 626, and both elements of LED pairs D116a, D116b, D117a and D117b are turned on; the energization of the red and green LED elements will produce a yellow color.

Assuming that the wiring condition is correct, at step 628 the microcontroller U100 will determine whether or not the operator has pushed push button S101, indicating that a GFCI test ought to be performed at step 630. The program next inspects push button S102 to determine whether the operator has pressed it. If so, the program branches to step 634 for the initiation of an AFCI test. Subroutines for these tests are similar to those shown in FIGS. 18c and 18d.

Figures 26, 27:
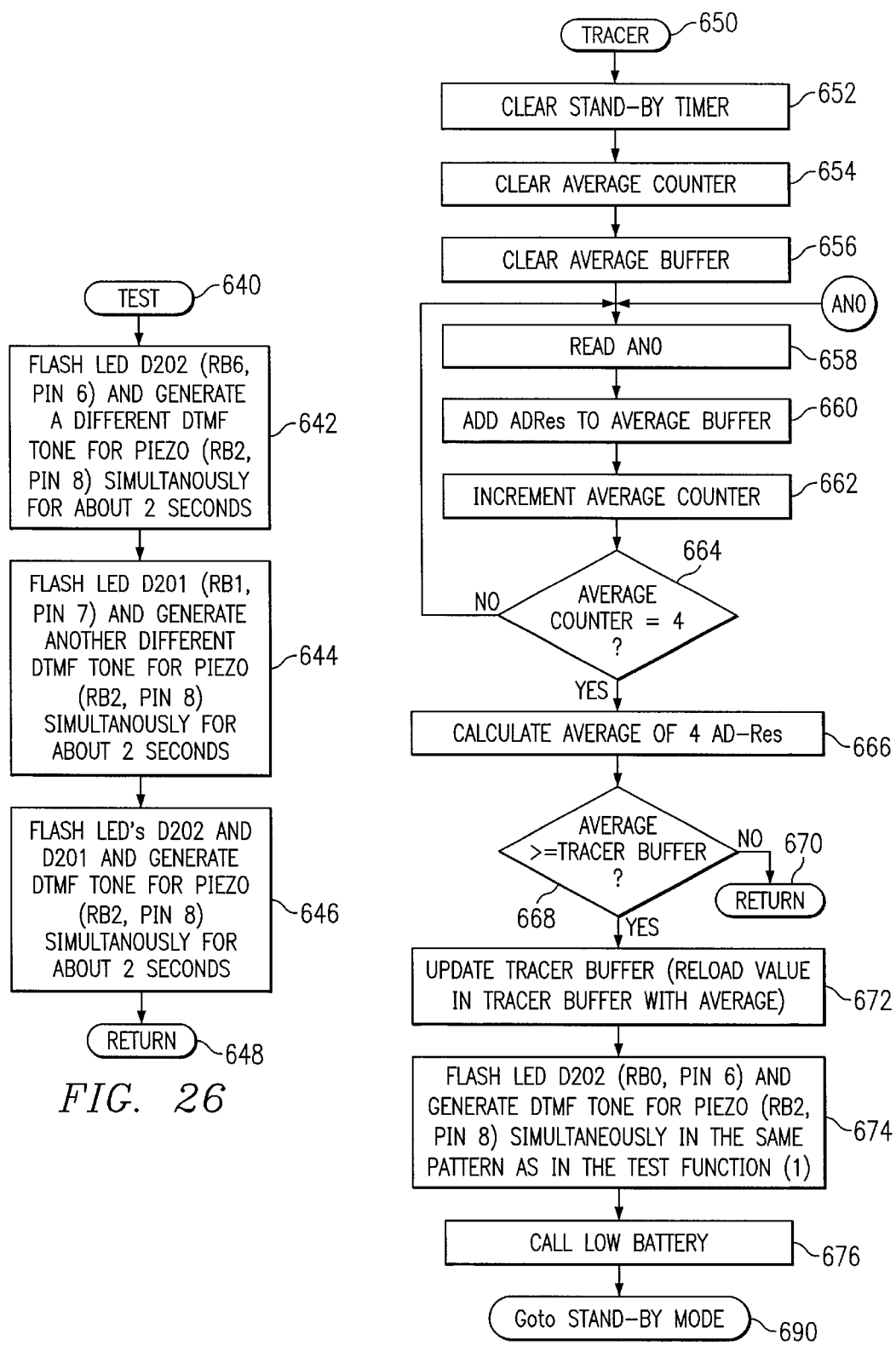
FIG. 26 is a flow chart of a testing algorithm according to the invention.
FIG. 27 is a flow chart of a TRACER subroutine used by the signal detector shown in FIG. 24.

FIG. 26 shows a TEST subroutine 640 that is implemented by microcontroller U204 (FIG. 24) upon power up. At step 642, D202 and a first DTMF tone will be generated for about two seconds. At step 644 the other LED D201 will be actuated, and a second DTMF tone will be emitted from the buzzer BZ2000 for about two seconds. Then, at step 646, both LEDs D202 and D201 will be actuated and a DTMF tone will be generated by the buzzer BZ200 for about two seconds. The procedure then returns at step 648.

FIG. 28 is a flow chart of subroutine TRACER which begins at step 650. This subroutine is entered once an energized circuit has been found by SENSOR (described below). A standby timer, average counter, and average buffer are cleared at steps 652, 654 and 656 by microcontroller U204 (FIG. 24). At step 658, analog input pin 17 is read and stored to a value ADRes. This value is added to the average buffer at step 660. At step 662, the average counter is incremented and at step 664 is compared against a count value of four. Steps 658–664 are repeated for four cycles. A step 666, the average of four readings is calculated. A step 668, the subroutine asks whether this average is greater than or equal to the value presently stored in the tracer buffer. If not, the program returns at 670. If, however, the sensed and averaged value exceeds the present value in the tracer buffer, this new value is stored in the tracer buffer at step 672. At step 674, the program announces to the user the presence of the strongest-yet magnetic field detected. At step 676, a low battery subroutine is called. This low battery subroutine is illustrated in FIG. 28. At step 678, pin 14 ($V_{dd}$) is read and at step 680 compared against a stored minimum DC voltage value such as 3 volts. If sufficient DC voltage is being supplied to the microcontroller U204, the subroutine returns at step 682. If the voltage has decreased below 3 volts, the power is shut off at step 684. Both LEDs D201 and D202 are flashed at step 686 and the piezo buzzer BZ200 is actuated. The program then goes to a READTIMER0 subroutine at step 688.

Assuming that the subroutine LOWBATTERY returns after making sure that the DC voltage has not declined below 3 volts, at step 690 in FIG. 27, the program goes to a STANDBY mode. This subroutine is shown in FIG. 29. In STANDBY mode, the program switches LEDs D202 and D201 on but switches the piezo buzzer BZ200 off.

FIG. 30 illustrates a SENSOR subroutine, which begins at step 700. This subroutine is used to find, and to quantify, a nearby energized circuit picked up by antenna ANT 200 (FIG. 24). At step 702, the standby timer is cleared and at step 704 an analog input of the microcontroller U204 is read. At step 706, variable ADRes is prepared as a proportional value for the sound pattern. That is, a lookup table is accessed which correlates different values of ADRes to different sound frequencies. At step 708, LED 201 is flashed and at the same time a DTMF tone is generated. After calling the LOWBATTERY subroutine, the procedure exits to STANDBY mode.

FIG. 31 is a flow diagram of a POWEROFF subroutine which begins at step 750. LEDs D201 and D202 are shut off, and the piezo buzzer is shut off, at step 752. The processor is put to sleep at step 754.

Figure 32:
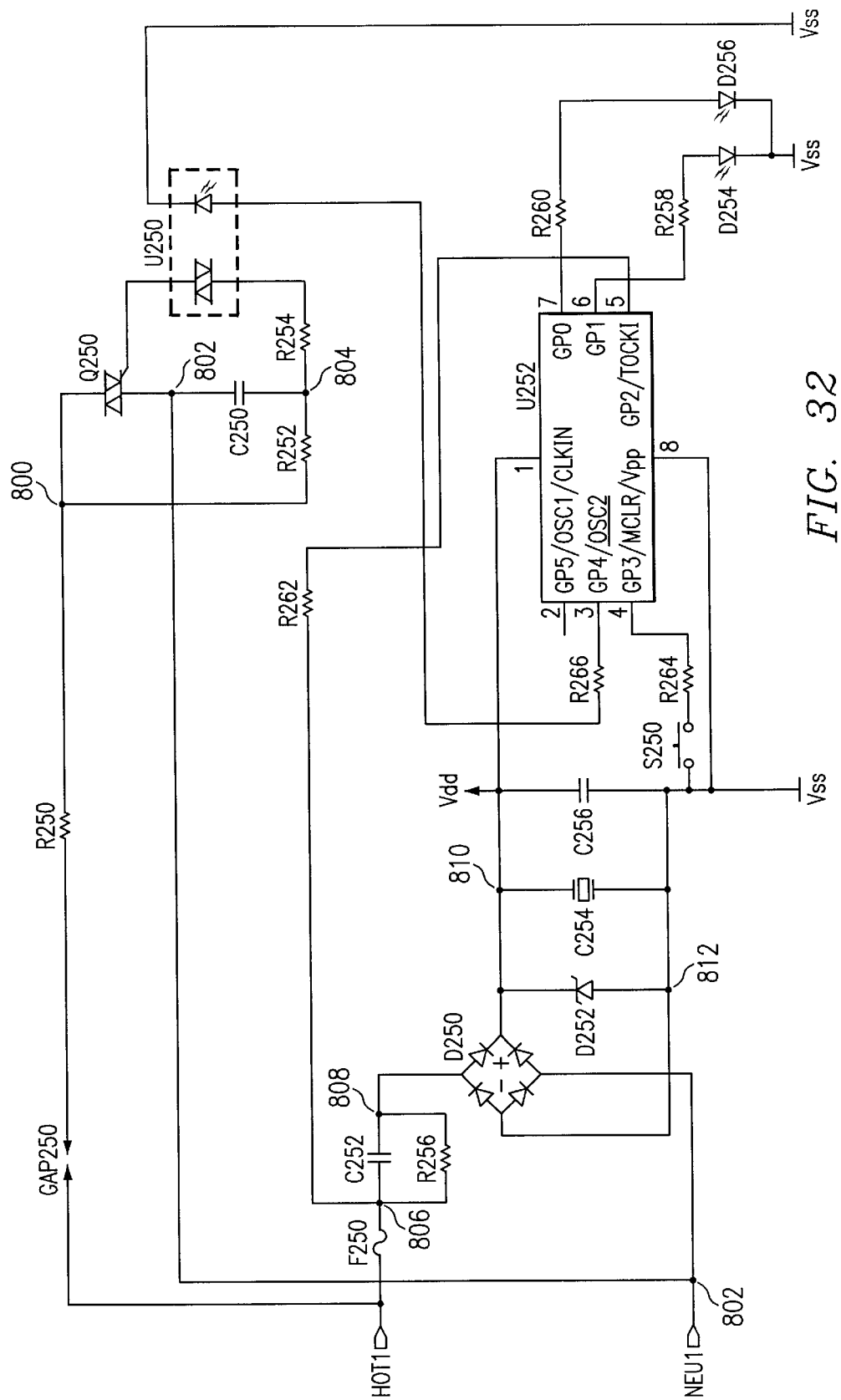
FIG. 32 is a schematic electrical diagram of a further embodiment of an arc fault current interrupt testing device according to the invention.

FIG. 32 is a further embodiment of an arc fault testing apparatus according to the invention. A spark gap GAP250 has a first terminal connected to a HOT terminal of the device. A second terminal of the spark gap GAP250 is connected through a resistor R250 to a node 800. The current path of a triac Q250 connects the node 800 to a node 802, which in turn is connected to the NEUTRAL terminal of the device. A capacitor C250 connects node 802 to node 804. A resistor R252 connects node 804 to node 800. A further resistor R254 connects node 804 to one side of a thyristor component of an optoisolator U250; the second end of this current path is connected as a gate to triac Q250. A fuse F250 connects the HOT terminal to a node 806, which is connected by a capacitor C252 and a resistor R256 to a node 808. This is connected to a first AC input of a diode bridge D250. NEUTRAL node 802 serves as a second AC input to the diode bridge D250. The diode bridge D250 provides a full wave rectified DC signal on a positive output node 810 as referenced against a negative DC output voltage node 812. A Zener diode D252, a capacitor C254, and a capacitor C256 connect positive and reference DC nodes 810 and 812 together. DC positive power node 810 is fed to a power input of an integrated circuit U252. Node 812 is connected to signal ground and a further input of the integrated circuit 252. Integrated circuit U252 has a pair of LED driving outputs which drive LEDs D254 and D256 through respective resistors R258 and R260. Pin 5 of the integrated circuit U252 is connected through a resistor R262 back to node 806.

In operation, the integrated circuit U252 is able to sense whether or not a voltage exists across the hot and neutral terminals, and selectively actuates diodes D254 and D256 to tell the user whether or not there is a difference in electric potential between these two points. When the user wishes to simulate an arc fault for testing purposes, the user presses push button S250, which will cause a signal to be received through resistor R264 to an input of the controller U252. Upon actuation of the signal the controller will bring its pin 3 high. Current will then flow through a current limiting resistor R266 to the light emitting diode component of optoisolator U250 and thence to ground. This actuates the thyristor component of optoisolator U250 to gate triac Q250 to an on condition. This causes a short circuit between hot and neutral terminals and an arc across GAP250, thereby transmitting an arcing condition back to the branch circuit being tested.

The relatively simple embodiment shown in FIG. 32 is suitable for inclusion with third party wiring testing circuitry.

While this invention is susceptible of embodiments in many different forms, only certain embodiments of the invention have been described, with the understanding that the present disclosure is to be considered as exemplary illustrations of the principles of the invention and is not intended to limit the broad aspects of the invention to the embodiments illustrated. The present invention is limited only by the scope and spirit of the appended claims.

What is claimed is:

1. A receiver for use in locating a first AC power branch circuit, comprising:

A sensing circuit for detecting, in a proximate one of a plurality of AC power branch circuits including the first AC power branch circuit, an identification signal, the identification signal being strongest on the first AC power branch circuit;

a memory coupled to the sensing circuit for storing a strength of the detected identification signal; and a comparator coupled to the memory for comparing the strength of a currently sensed identification signal to a stored identification signal; and an indicator coupled to the comparator and providing an indication to the user that a currently sensed identification signal has a strength which is at least as great as that of the stored identification signal, thereby permitting the user to identify the first AC power branch circuit.

2. The receiver of claim 1, wherein the comparator comprises a programmed microcontroller.

3. A method of distinguishing a first AC power distribution circuit from others of a plurality of AC power distribution circuits including the first AC power distribution circuit, comprising the steps of:

generating an identification signal on the first AC power distribution circuit from a first location;

at a second location remote from the first location, moving a mobile receiver to be adjacent a selected one of the plurality of AC power distribution circuits;

detecting a signal strength of the identification signal in the selected one of the AC power distribution circuits;

storing the detected signal strength;

moving the mobile receiver to be adjacent a second selected one of the plurality of AC power distribution circuits;

detecting a second signal strength of the identification signal as present in the second selected one of the AC power distribution circuits;

comparing the second signal strength to the stored signal strength;

if the second signal strength is greater than or equal to the stored signal strength, giving an indication thereof to a user;

if the second signal strength is greater than or equal to the stored signal strength, replacing the stored signal strength with the second signal strength; and repeating said steps of detecting, comparing, indicating and replacing until the first AC power distribution circuit is identified.

* * * * *